(12) United States Patent
Szczypinski

(10) Patent No.: US 7,170,819 B2
(45) Date of Patent: Jan. 30, 2007

(54) INTEGRATED SEMICONDUCTOR MEMORY DEVICE FOR SYNCHRONIZING A SIGNAL WITH A CLOCK SIGNAL

(75) Inventor: Kazimierz Szczypinski, München (DE)

(73) Assignee: Infineon Technologies AG, Munich (DE)

( * ) Notice: Subject to any disclaimer, the term of this patent is extended or adjusted under 35 U.S.C. 154(b) by 9 days.

(21) Appl. No.: 11/121,171

(22) Filed: May 4, 2005

(65) Prior Publication Data

US 2006/0250883 A1  Nov. 9, 2006

(51) Int. Cl.
G11C 8/00 (2006.01)
G11C 7/00 (2006.01)

(52) U.S. Cl. ............ 365/233; 365/189.05; 365/189.12; 365/194; 365/236

(58) Field of Classification Search ................. 365/233, 365/189.05, 189.12, 194, 236
See application file for complete search history.

(56) References Cited

U.S. PATENT DOCUMENTS

| | | | | |
|---|---|---|---|---|
| 5,517,462 A | * | 5/1996 | Iwamoto et al. | 365/233 |
| 6,075,393 A | * | 6/2000 | Tomita et al. | 327/153 |
| 6,636,110 B1 | * | 10/2003 | Ooishi et al. | 327/565 |

* cited by examiner

Primary Examiner—Son T. Dinh
(74) Attorney, Agent, or Firm—Edell, Shapiro & Finnan, LLC

(57) ABSTRACT

A semiconductor memory includes a control circuit for generating an internal read command signal depending on an externally applied read command signal. A clock generating circuit generates a system clock signal and a time shifted clock signal generated by a DLL circuit. A latency counter circuit comprises a first control circuit for generating a first control signal and a second control circuit for generating a second control signal. The first control signal is used to latch the internal read command signal in one of FIFO-latching cells. The latching is carried out in a system clock domain. The second control signal is used to release a time shifted internal read command signal from one of the FIFO-latching cells in a DLL clock domain. The relationship between first and second control signals determines a CAS latency by which data items appear at a data terminal synchronous with an externally applied clock signal.

22 Claims, 12 Drawing Sheets

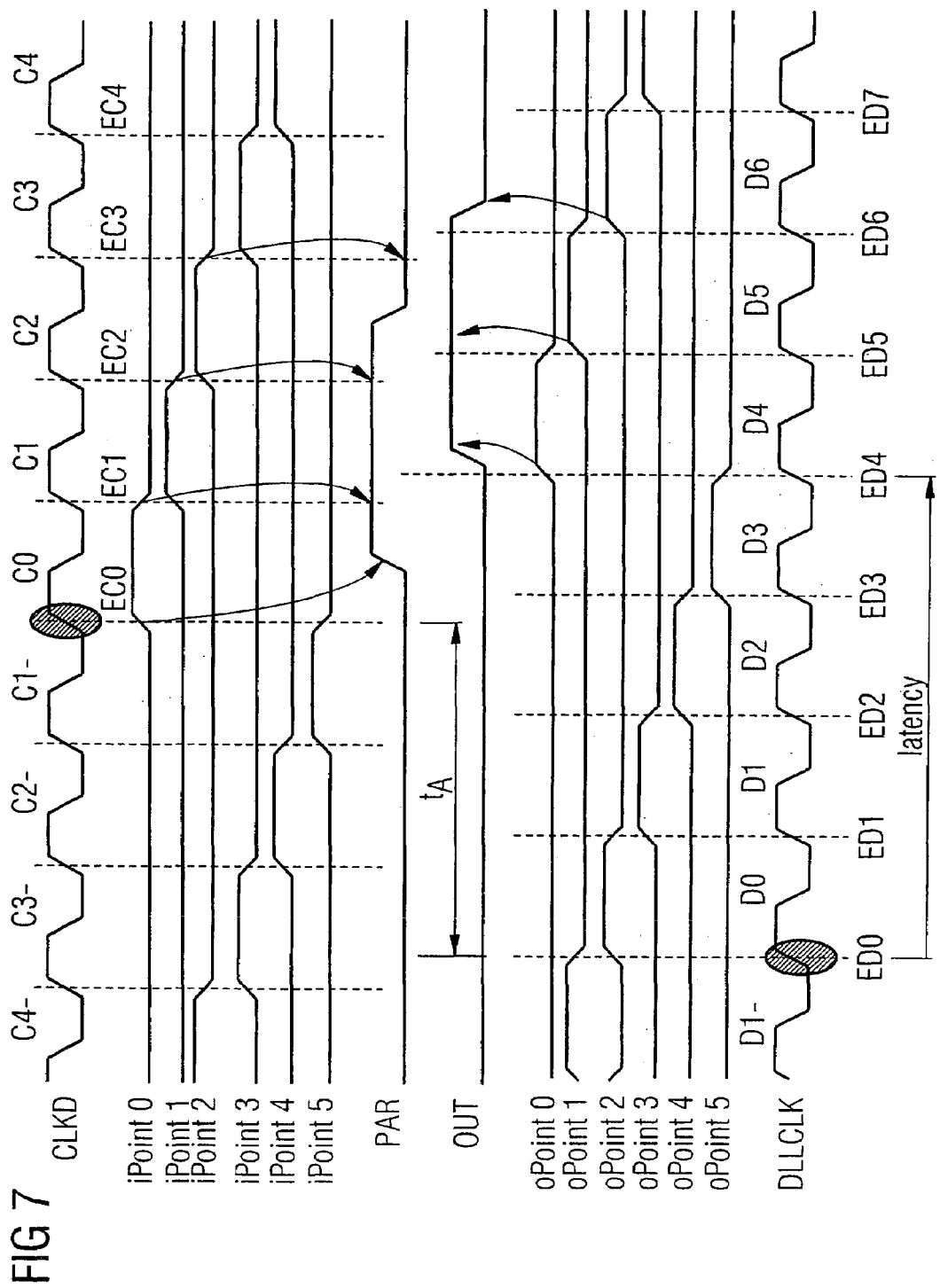

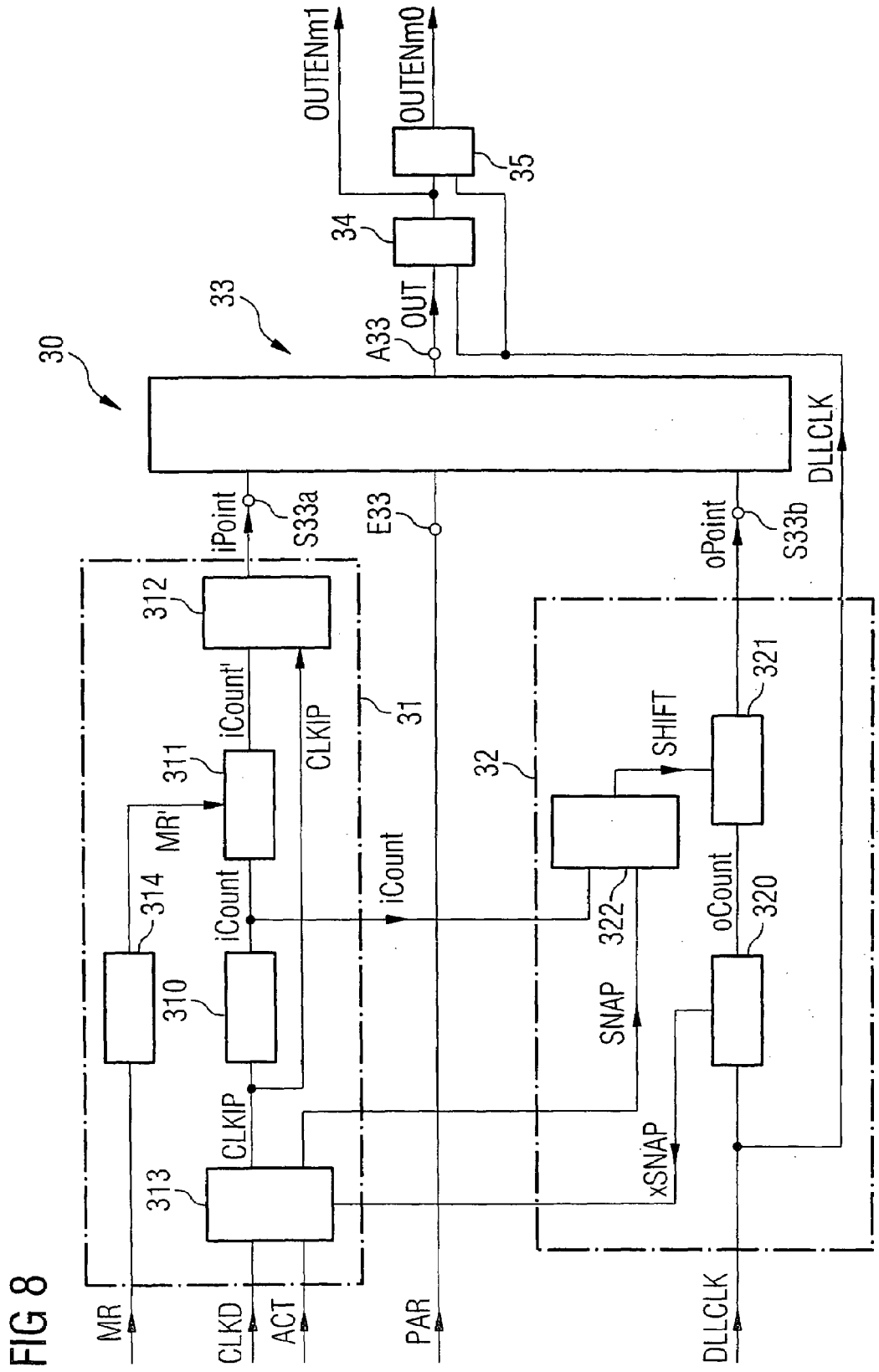

INTEGRATED SEMICONDUCTOR MEMORY DEVICE FOR SYNCHRONIZING A SIGNAL WITH A CLOCK SIGNAL

FIELD OF THE INVENTION

The invention relates to an integrated semiconductor memory device for synchronizing a signal, such as a data signal, with a clock signal, and a method for the same.

BACKGROUND OF THE INVENTION

FIG. 1 shows a semiconductor memory 100 with a memory cell array 40. The memory cell array comprises memory cells which are designed as DRAM (dynamic random access memory) cells, for example. For the sake of simplicity, only one memory cell comprising a storage capacitor SC and a selection transistor AT is illustrated in the memory cell array 40. The control terminal of the selection transistor AT is connected to a wordline WL. The storage capacitor SC is connected to a terminal for application of a reference potential, and is also connected to a bitline BL via the controllable path of the selection transistor.

Read or write accesses are controlled synchronously with an external clock signal CLKE, applied to a clock terminal T100. A clock receiver circuit 20 receives the external clock signal CLKE and generates an internal clock signal CLKI. Internal procedures such as activating the memory cell SZ by turning on and off the selection transistor AT are operated synchronously with the internal clock signal CLKI.

For the read access to a memory cell, a read command RD is externally applied to a control terminal S100b connected to a control circuit 10. As a result, the memory cell SZ is activated for a read access, and a data item DQ stored in the memory cell SZ is supplied to an output circuit 50 for buffering. After having received read command RD, control circuit 10 generates an internal read command signal PAR synchronous with rising and falling edges of the internal clock signal CLKI. The internal read command signal PAR is transmitted to a latency counter circuit 30. After a delay time which is determined depending on a configuration signal MR applied to a control terminal S100a, latency counter circuit 30 generates a time-shifted internal read command signal OUT synchronous with the internal clock signal CLKI. The time-shifted internal read command signal OUT actuates output circuit 50. As a result, output circuit 50 is enabled to output the buffered data item DQ to a data terminal IO100.

Due to internal delay and processing times of the output circuit 50, which are mainly effected by a data path delay time $t_{Dp}$ and an off-chip driver delay time $t_{OCD}$ of the output circuit, the data item DQ does not appear simultaneously with the instant the external read command RD is applied to control terminal S100b. In order to avoid data items being generated at the data terminal IO100 at arbitrary points in time after the external read command RD has been applied to control terminal S100b, the latency between applying the external read command RD and the instant when the appropriate data item appears at the data terminal IO100 is set to a predetermined value depending on configuration signal MR. The latency is usually specified by the so-called CAS latency.

Instead of using a single internal clock signal CLKI, a modern SDRAM (synchronous dynamic random access memory) device runs in different clock domains. Clock receiver 20 of FIG. 1, for example, is applied by an external clock signal and generates a system clock signal CLKD which is delayed with regard to the external clock signal CLKE. A DLL (delay lock loop) circuit is connected to the clock receiver circuit for generating a DLL clock signal, DLLCLK, with a constant lead time to the system clock signal CLKD. The internal read command signal PAR is, for example, generated by the control circuit 10, synchronous with the system clock signal CLKD, whereas the time-shifted internal read command signal OUT is generated by the latency counter circuit 30, synchronous with the DLL clock signal DLLCLK.

FIG. 2 shows the relation between the clock signals CLKE, CLKD and DLLCLK. The system clock signal CLKD is delayed with regard to the external clock signal CLKE by a clock receiver delay time $t_{RCV}$ including subsequent driver delay times. The DLL clock signal DLLCLK runs "in advance" of the system clock signal CLKD. A time shift $t_A$ between the two clock signals CLKD and DLLCLK is equal to the sum of delay times $t_{RCV}$, $t_{Dp}$ and $t_{OCD}$. This relation is maintained by the DLL circuit and is valid anytime the DLL circuit is locked and the clocks are not switched, as for example when the integrated memory is operated in a power down mode causing discontinuities of the clock signals. The time shift $t_A$ of the DLL clock signal DLLCLK is chosen such that the data item DQ, which is internally triggered by the DLL clock signal DLLCLK, appears externally aligned to the marked edge of the external clock signal CLKE when output circuit 50 is actuated by the time-shifted internal read command signal OUT, at the marked edge of DLL clock signal DLLCLK.

The time shift $t_A$ changes with temperature and supply voltage. However, the DLL circuit iteratively adjusts the DLL clock signal DLLCLK to the system clock signal CLKD. As illustrated in FIG. 2, the DLL clock signal DLLCLK runs "in advance" of the external clock signal CLKE and the internal clock signal CLKD. The marked rising edges of the external clock signal CLKE, the system clock signal CLKD and the DLL clock signal DLLCLK correspond to each other such that the marked rising edge of the system clock signal CLKD is generated by clock receiver circuit 20 with the delay time $t_{RCV}$ when the corresponding edge of the external clock signal CLKE actuates the clock receiver circuit 20. Furthermore, if the output circuit 50 is enabled at the marked rising edge of the DLL clock signal DLLCLK, a data item buffered in output circuit 50 appears at the data terminal IO100 at the rising edge of external clock signal CLKE. In the example shown in FIG. 2, the DLL circuit generates the DLL clock signal such that a corresponding edge of the DLL clock signal DLLCLK runs "in advance" of the corresponding edge of the system clock signal CLKD by a time shift $t_A$ of 1.5 clock cycles.

FIG. 3A shows the two clock signals CLKD and DLLCLK. The DLL clock signal DLLCLK runs "in advance" of the system clock signal CLKD. The internal read command signal PAR is generated in a system clock domain, whereas the time-shifted internal read command signal OUT is generated in a DLL clock domain. If a data signal appears at data terminal IO100 when the marked rising edge EC0 of the system clock signal CLKD is valid, the time-shifted internal read command signal OUT is valid at the marked rising edge ED0 of the DLL clock signal DLLCLK, which is 1.5 clock cycles ahead of the marked rising edge EC0 of the system clock signal CLKD. However, this is not possible because the time-shifted internal read command signal OUT is generated after the latency counter circuit 30 is actuated by the internal read command signal PAR. If the internal read command signal PAR is generated at the marked rising edge EC0 of the system clock signal CLKD, the marked rising edge ED0 of the time-shifted clock signal DLLCLK has passed 1.5 clock cycles in advance. This means, with the clock constellation shown in FIG. 3A, the time-shifted internal read command signal OUT is generated by the latency counter circuit 30 with a target delay of at least two clock cycles $t_{CK}$ with regard to the clock cycle of the marked edge ED0 of the DLL clock signal DLLCLK.

FIG. 3B shows the system clock signal CLKD and the DLL clock signal DLLCLK with a higher frequency than the clock signals shown in FIG. 3A. The time shift $t_A$ is the same as the one shown in FIG. 3A, because the time shift is dependent only on the constant parameters of the data path delay time $t_{DP}$, off-chip driver delay time $t_{OCD}$ and clock receiver delay time $t_{RCV}$. Due to the higher frequency, the corresponding edges EC0 and ED0 of the system clock signal CLKD and the DLL clock signal DLLCLK are time-shifted with regard to one another by about three clock cycles. If the internal read command signal PAR is valid at the marked edge EC0 of system clock signal CLKD, the time-shifted internal read command signal OUT is generated at the rising edges ED3, ED4, . . . , EDm, which are delayed by 3, 4, . . . , m clock cycles $t_{CK}$ with regard to the marked rising edge 0 of the DLL clock signal DLLCLK.

With very low clock frequencies, as shown in FIG. 3C, the internal read command signal PAR is generated and triggered with the marked rising edge EC0 of system clock signal CLKD a long time ahead of the rising edge ED1 of the DLL clock signal DLLCLK, but after the marked rising edge ED0 of the DLL clock signal DLLCLK.

The number of clock cycles $t_{CK}$ between the marked edge ED0 and the edge of the DLL clock signal DLLCLK at which the time-shifted internal read command signal OUT is generated is dependent on the configuration signal MR. The CAS latency is a value which indicates the number of clock cycles between the point in time when the external read command signal RD is applied to control terminal S100b to start a read access to a memory cell and the point in time when the data item DQ of this memory cell appears at data terminal IO100. One clock cycle before the data is driven out, a preamble for a data strobe signal is activated. For this reason, the time-shifted internal read command signal OUT is synchronized with a rising edge of the DLL clock signal DLLCLK, which is one clock cycle $t_{CK}$ earlier than the value of the CAS latency indicates.

FIG. 3A shows the constellation wherein the time shifted internal read command signal OUT is synchronized with the rising edge ED2 of the DLL clock signal DLLCLK, which is two clock cycles $t_{CK}$ after the marked rising edge ED1 of the DLL clock signal DLLCLK. The CAS latency for this constellation equals 3.

In FIG. 3B, the minimum possible target delay is three clock cycles $t_{CK}$ later than the marked rising edge ED0 of the DLL clock signal DLLCLK. The CAS latency for this constellation equals 4.

In FIG. 3C, the time-shifted internal read command signal OUT is synchronized with the first rising edge ED1 of the DLL clock signal DLLCLK following the rising edge ED0. The CAS latency for this clock constellation equals 2.

FIG. 4 shows an embodiment used in a Graphic DRAM to synchronize the time shifted internal read command signal OUT derived from the internal read command signal PAR with one of the rising edges of the DLL clock signal DLLCLK. The shift between rising edge ED0 of the DLL clock signal DLLCLK and the edge with which the time shifted internal read command signal OUT is synchronized is given by the configuration signal MR which is supplied to a latency counter circuit 30'. A clock generating circuit 20' comprises a clock receiver 21', a DLL circuit 22' and a DLL feedback delay circuit 23'. The clock receiver circuit 21' is supplied with the external clock signal CLKE and generates the system clock signal CLKD, which is time-shifted by the DLL circuit 22' and produced, in the DLL clock domain, as DLL clock signal DLLCLK. The DLL clock signal DLLCLK is driven to the latency counter circuit 30'. The latency counter circuit 30' is also driven by a clock signal PARCLK, which is generated by the DLL feedback delay circuit 23'. The clock signal PARCLK is a clock signal delayed with regard to the DLL clock signal DLLCLK by 4–6 ns and a margin of 0.5 clock cycles of the DLL clock signal DLLCLK.

The latency counter circuit 30' includes an input counter circuit 31' and an output counter circuit 32'. The output counter circuit 32a' is connected, via a shift register 32b', to a latch circuit 33' comprising FIFO (first-in-first-out) latching cells. The shift register 32b' is driven by a control signal derived from the configuration signal MR by a latency decoder 34'. A control signal iPoint' is generated synchronously with the delayed clock signal PARCLK. A control signal oPoint' is generated synchronously with the DLL clock signal DLLCLK. Depending on a state of the control signal iPoint' the internal read command signal PAR is latched into one of the FIFO latching cells of the latch circuit 33'. The internal read command signal PAR is released from one of the FIFO latching cells depending on the state of the control signal oPoint'. The shift generated in the shift register 32b' determines the number of clock cycles by which the time shifted internal read command signal OUT is delayed in relation to the internal read command signal PAR.

In the described solution for a graphic DRAM, the control signals iPoint' and oPoint' are aligned once just after the DLL circuit 22' is locked. The alignment is accomplished by an initialization sequence in an initialization phase of the integrated memory. After termination of the initialization sequence, the integrated memory is switched into a normal operation mode for read or write access. In the normal operation mode, all clock switching is carried out such that control signals iPoint' and oPoint' are kept aligned. However, misaligned control signals remain stable until the next reset of the DLL circuit. Intermediate resets are not possible. This means that the solution usually applied for graphic DRAMs does not allow a self-adjustment of the control signals iPoint' and oPoint'.

Furthermore, problems occur during a fast recovery of the state of the control signals iPoint' and oPoint' after a power down exit. The clock signal PARCLK, synchronized with the control signal iPoint', is derived from the DLL clock signal DLLCLK and delayed with regard to the DLL clock signal DLLCLK by several clock cycles $t_{CK}$. Due to a very tight timing budget after a power down exit, there may be no clock signal PARCLK available for latching an early internal read command signal PAR.

A further method for synchronizing the internal read command signal PAR with the DLL clock signal DLLCLK is used in commodity DRAMs. In this case, several clock signals derived from the DLL clock signal DLLCLK are generated with different delay times. The internal read command signal PAR is latched synchronously with the different delayed clock signals, until it is latched synchronously with the DLL clock signal DLLCLK. However, due to the high operation frequency in a modern DRAM, the large number of differently delayed clock signals required to ensure a reliable synchronization is no longer available.

Therefore, integrated semiconductor memories using such a solution for synchronization are operated at low frequencies.

SUMMARY

The present invention provides an integrated semiconductor memory device and method for synchronizing a signal with a clock signal with great reliability.

The integrated semiconductor memory device includes a first control terminal for applying a configuration signal, a clock generating circuit for generating a first clock signal and a second clock signal, the second clock signal being time-shifted with regard to the first clock signal, a first control circuit for generating a first control signal and generating an internal clock signal, delayed with regard to the first clock signal. The first control circuit is designed to generate the first control signal synchronous with the internal clock signal, at a time dependent on the configuration signal. Furthermore, the integrated semiconductor memory device comprises a second control circuit for generating a second control signal synchronous with the second clock signal, a latch circuit for latching a first command signal and releasing a second command signal. The latch circuit is designed to latch the first command signal synchronous with the internal clock signal when the latch circuit is actuated by the first control signal, and the second command signal is released synchronously with the second clock signal when the latch circuit is actuated by the second control signal.

By controlling the generation of the first control signal from a clock signal which is derived from a first clock signal, and by controlling the generation of the second control signal from a second clock signal, a self adjusting alignment circuit concept results. A delay of the clock signal to which the first control signal is triggered, in a conventional manner, for example according to the embodiment of a latency counter circuit for a graphic DRAM, is thus avoided. If the integrated semiconductor memory device is activated again after a power down mode, (e.g., operated in a kind of stand-by-mode to save power and in which no read or write access takes place) the alignment of the first and second control signal is performed very quickly. Furthermore, after the power down exit, the first command signal is latched in the latch circuit, even if the second clock signal is still not available, since the latching procedure is synchronous with the first clock signal, which is immediately available after the power down exit. Therefore, the earliest possible first command signal, such as an internal read command signal, is latched.

In a further embodiment of the integrated semiconductor memory device, the device comprises a clock terminal for applying an external clock signal, wherein the external clock signal is supplied to the clock generating circuit. A second control terminal is provided for applying an external command signal synchronous with the external clock signal. The clock generating circuit is designed to generate the first and second clock signals with a frequency dependent upon the external clock signal, wherein the first clock signal is delayed in relation to the external clock signal by a first delay time. A third control circuit is provided for generating the first command signal synchronous with the first clock signal, wherein the third control circuit is designed to generate the first command signal after actuation by the external command signal.

In another embodiment, the integrated semiconductor memory device includes at least one memory cell to store a data item, a data terminal for providing the data item, and an output circuit for buffering the data item and for providing the data item at the data terminal. The memory cell is activated for the read access when the external command signal is applied to the second control terminal, wherein, during the read access, the data item is supplied from the memory cell to the output circuit for buffering the data item. The output circuit is designed such that it provides the data item at the data terminal after a second delay time, after actuation by the second command signal.

According to a further design of the integrated semiconductor memory device, the first clock signal is supplied to the first control circuit, and the second clock signal is supplied to the second control circuit.

In a further embodiment of the integrated semiconductor memory device, the clock generating circuit is designed such that an edge of a first clock cycle of the second clock signal is generated by the clock generating circuit time-shifted with regard to an edge of a first clock cycle of the first clock signal by a first time shift, wherein the first time shift is equal to a sum of the first and second delay time. The first control circuit is designed such that an edge of a first clock cycle of the internal clock signal is generated by the first control circuit delayed with respect to the edge of the first clock cycle of the first clock signal by a second time shift, wherein the second time shift has a duration of at least a processing time of the third control circuit, the processing time is equal to a time duration between the edge of the first clock cycle of the first clock signal and the time when the first control signal is generated by the third control circuit. Furthermore, the first control circuit is designed such that a state of the first control signal is shifted by a number of clock cycles of the internal clock signal in relation to the first clock cycle of the internal clock signal, wherein the number of clock cycles is dependent on the configuration signal. The second control circuit is designed to generate the second control signal at the first clock cycle of the second clock signal.

In a further implementation of the integrated semiconductor memory device, the first control circuit includes a counter circuit for generating a first counter signal, a shift register for generating a time-shifted first counter signal, a latch for generating the first control signal and a delay/clock circuit. The first clock signal is supplied to the clock/delay circuit of the first control circuit. The configuration signal is supplied to the shift register of the first control circuit. The delay/clock circuit of the first control circuit is designed to generate the internal clock signal derived from the first clock signal. The internal clock signal is supplied to the counter circuit of the first control circuit. The counter circuit of the first control circuit is designed to generate the first counter signal synchronous with the internal clock signal. The first counter signal is supplied to the shift register of the first control circuit. The shift register of the first control circuit is designed to generate the time-shifted first counter signal synchronous with the internal clock signal, wherein a state of the time-shifted first counter signal is shifted by a number of clock cycles of the internal clock signal in relation to the first clock cycle of the internal clock signal. The latch of the first control circuit is actuated by the time-shifted first counter signal and the internal clock signal. The latch of the first control circuit is designed to generate the first control signal synchronous with the internal clock signal.

According to a further embodiment of the integrated semiconductor memory device, the second control circuit includes a counter circuit for generating a second counter signal, and a shift register for generating the second control signal. The counter circuit of the second control circuit is actuated by the second clock signal. The counter circuit of the second control circuit is designed to generate the second counter signal synchronous with the second clock signal. The second counter signal is supplied to the shift register of the second control circuit. The shift register of the second control circuit is designed to generate the second control signal synchronous with the second clock signal, wherein a state of the second counter signal is shifted by a number of clock cycles of the second clock signal in relation to the first clock cycle of the second clock signal.

In another embodiment of the integrated semiconductor memory device, the second control circuit includes a latch for generating a first internal control signal. The latch of the second control circuit is actuated by the first counter signal. The latch of the second control circuit is designed to generate a state of the first internal control signal which indicates a state of the first counter signal at the first clock cycle of the internal clock signal. The first internal control signal is supplied to the shift register of the second control circuit.

In still further embodiment of the integrated semiconductor memory device, the first control circuit includes the delay/clock circuit for generating a second internal control signal. The second control circuit includes the counter circuit for generating a third internal control signal. The third internal control signal is supplied to the delay/clock circuit of the first control circuit. The counter circuit of the second control circuit is designed to generate the third internal control signal when a change of state of the second counter signal is generated by the counter circuit of the second control circuit. The delay/clock circuit of the first control circuit is designed to generate a first state of the second internal control signal at the first clock cycle of the internal clock signal. The latch of the second control circuit is supplied with the second internal control signal. The latch of the second control circuit is designed such that it generates the first internal control signal with the state of the first internal control signal, which indicates the state of the first counter signal when the second internal control signal takes on the first state.

A further embodiment of the integrated semiconductor memory device provides the delay/clock circuit of the first control circuit including a delay circuit, a first latch and a second latch for generating the second internal control signal. The delay circuit and the latch circuits are designed to delay the third internal control signal by the first time shift in order to synchronize the third internal control signal with the first clock signal, and afterwards delay the third internal control signal by a third time shift to generate the second internal control signal, wherein the third time shift is shorter than the second time shift.

In another embodiment of the integrated semiconductor memory device the latching circuit comprises latches, wherein each of the latches of the latch circuit has an input terminal and an output terminal. The input terminals are connected with each other for latching the first command signal in one of the latches depending on a state of the first control signal. The output terminals are connected with each other for releasing the second command signal from one of the latches depending on a state of the second control signal.

Each of the latches of the latch circuit comprise a tri-state output.

In a still further embodiment of the integrated semiconductor memory device, the clock generating circuit comprises a delay lock loop circuit for generating the second clock signal.

In a another embodiment of the integrated semiconductor memory device, the counter circuit of the first control circuit and the counter circuit of the second control circuit both are designed as ring counters.

According to a further embodiment of the integrated semiconductor memory device, the counter circuit of the first control circuit and the counter circuit of the second control circuit both are designed as Gray-Code counter circuits.

According to another embodiment of the integrated semiconductor memory device, the counter circuit of the first control circuit and the counter circuit of the second control circuit both are designed as Binary-Code counter circuits.

In accordance with a further feature of the integrated semiconductor memory device, the shift register of the first control circuit and the shift register of the second control circuit are designed as Barrel-shifters.

According to another embodiment of the integrated semiconductor memory device, each of the latches of the first and second control circuits comprises flip-flops.

A method of synchronizing a signal with a clock signal in an integrated semiconductor memory device is specified below. According to the method, an integrated semiconductor memory device is provided comprising at least a memory cell, a data terminal for generating a data item, a clock terminal for applying an external clock signal, a first control terminal for applying a configuration signal, a second control terminal for applying an external command signal synchronous with the external clock signal, a clock generating circuit for generating first and second clock signals, a first control circuit for generating a first control signal, a second control circuit for generating a second control signal, a latch circuit with latches each for latching a first command signal and for releasing a second command signal. The external clock signal is applied to the clock terminal. Afterwards, the configuration signal is applied to the first control terminal. The external command signal is synchronously applied with the external clock signal at the second control terminal. The first clock signal is generated by the clock generating circuit and is derived from the external clock signal, the first clock signal being delayed with respect to the external clock signal. Furthermore, an internal clock signal is generated by the first control circuit and derived from the first clock signal. A first control signal is generated from the first control circuit synchronous with the internal clock signal at a point in time which depends on the configuration signal. The first command signal is generated as a result of applying the external command signal at the second control terminal. The first command signal is latched in one of the latches of the latch circuit synchronous with the internal clock signal by actuating one of the latches by a state of the first control signal. The second clock signal derived from the external clock signal is generated by the clock generating circuit, the second clock signal being time-shifted with regard to the first clock signal. The second control signal is generated by the second control circuit synchronous with the second clock signal which depends on the configuration signal. The second command signal is released from one of the latches of the latch circuit synchronous with the second clock signal by actuating one of the latches by a state of the second control signal. The memory cell is activated for a read access as a result of applying the external command signal. Finally, a data item stored in the activated memory cell is provided at the data terminal synchronous with the external clock signal, wherein the time between applying the external command signal and generation of the data item depends on the configuration signal.

In a refinement of the method according to the invention, an output circuit for providing a data item at a data terminal is provided, wherein the data item is provided at the data terminal after a first delay time. The first clock signal is generated by the clock generating circuit, wherein the first clock signal is delayed with respect to the external clock signal by a second delay time. The second clock signal is generated by the clock generating circuit, wherein an edge of a first clock cycle of the second clock signal is generated by the clock generating circuit time-shifted to an edge of a first clock cycle of the first clock signal by a first time shift, wherein the first time shift has a duration equal to a sum of the first and second delay time. The internal clock signal derived from the first clock signal is generated by the first control circuit, wherein an edge of a first clock cycle of the internal clock signal is generated by the first control circuit delayed in relation to the edge of the first cycle of the first clock signal by a second time shift.

A further method provides an integrated semiconductor memory device with a third control circuit for generating the first command signal synchronous with the first clock signal, wherein the third control circuit generates the first command signal delayed in relation to the edge of the first clock cycle of the first clock signal by the second time shift.

According to another way of implementing the method for synchronizing a signal with a clock signal in an integrated semiconductor memory device, the first control signal is generated by the first control circuit at a second clock cycle of the internal clock signal which is shifted by a number of clock cycles of the internal clock signal in relation to the first clock cycle of the internal clock signal, wherein the number of clock cycles is dependent on the configuration signal. The second control signal is generated by the second control circuit at the first clock cycle of the second clock signal.

BRIEF DESCRIPTION OF THE DRAWINGS

The invention is explained in more detail below with reference to the Figures illustrating exemplary embodiments of the invention.

FIG. 7 shows a timing diagram of clock and control signals of a simplified latency counter circuit according to the present invention;

FIG. 8 shows an embodiment of a latency counter circuit according to the present invention;

DETAILED DESCRIPTION OF THE INVENTION

Figure 5:
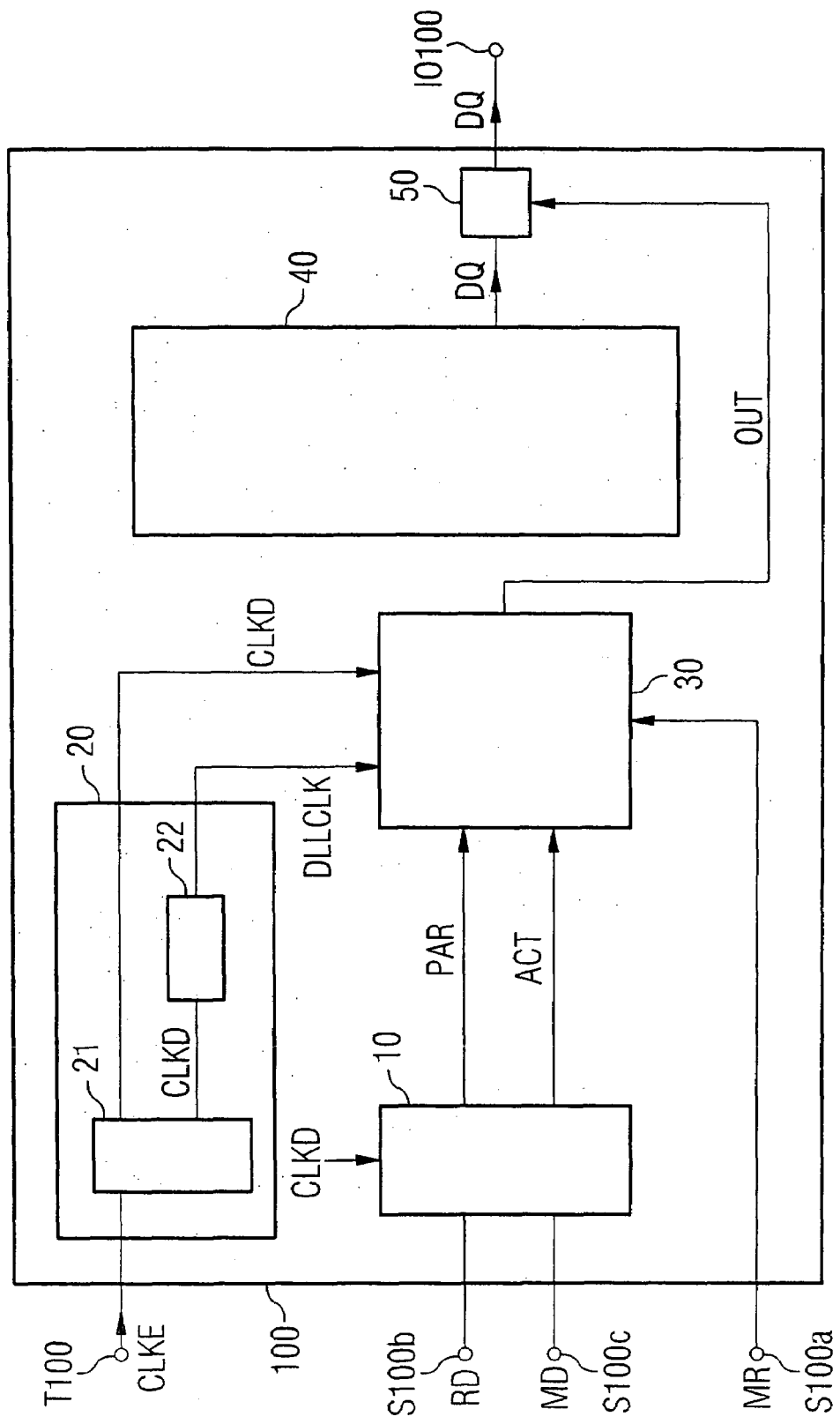
FIG. 5 shows an embodiment of an integrated semiconductor memory device for synchronizing a data item with an externally applied clock signal according to the present invention.

FIG. 5 shows an integrated semiconductor memory device for synchronizing data items DQ which appear, after a read access, at data terminal 10100 synchronous with a clock cycle of an external clock signal CLKE according to the present invention. An external read command signal RD is applied to a control terminal S100b to indicate a read access to a memory cell inside a memory cell array 40. A memory cell inside the memory cell array is activated and a data item stored therein is transferred to and buffered in an output circuit 50. A control circuit 10 is connected to the control terminal S100b and generates an internal read command signal PAR. The internal read command signal PAR is transmitted to a latency counter circuit 30. Depending on a configuration signal MR which is applied to a control terminal S100a and indicates a CAS latency, it generates a time-shifted internal read command signal OUT. The time-shifted internal read command signal OUT actuates the output circuit 50. After being actuated by the time shifted internal read command signal OUT, the output circuit supplies the buffered data item DQ at a data terminal IO100.

Figure 1:
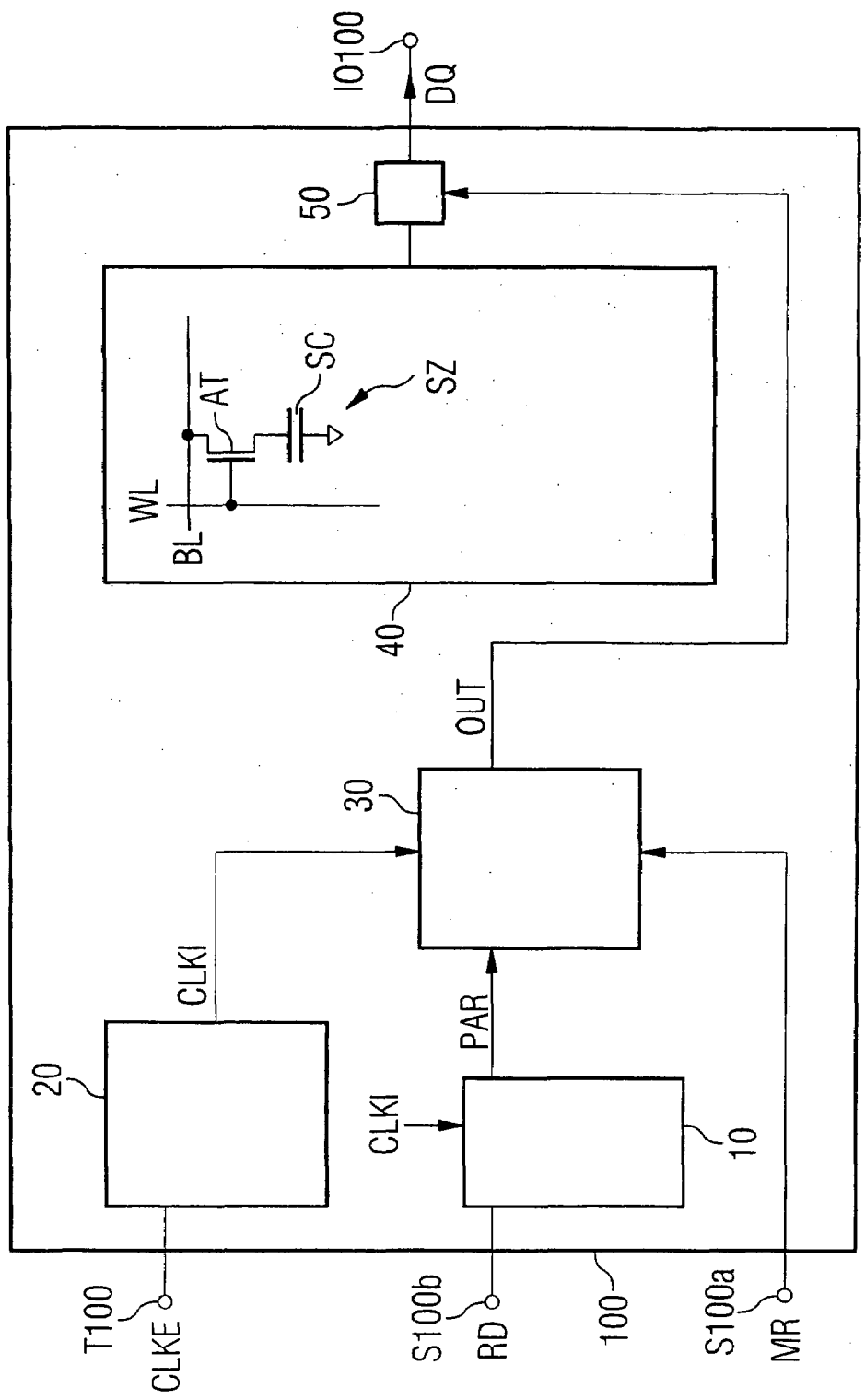
FIG. 1 shows a simplified schematic of an embodiment of an integrated semiconductor memory device for synchronizing a data item to an externally applied clock signal.
Figure 2:
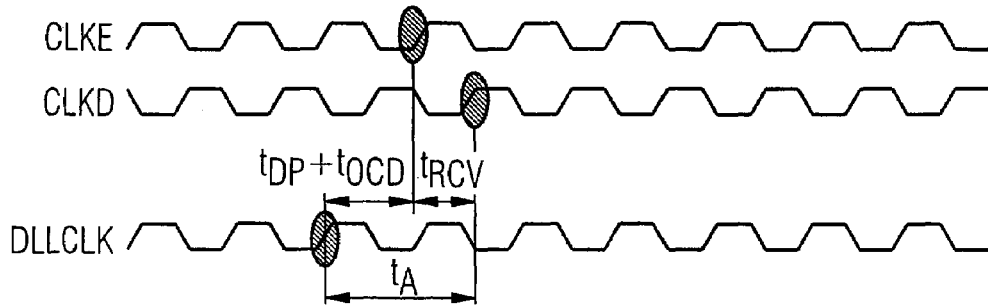
FIG. 2 shows three clock signals, CLKE, CLKD, DLLCLK, of an integrated semiconductor memory device being time-shifted with regard to each other by different delay times according to the present invention.
Figure 3A:
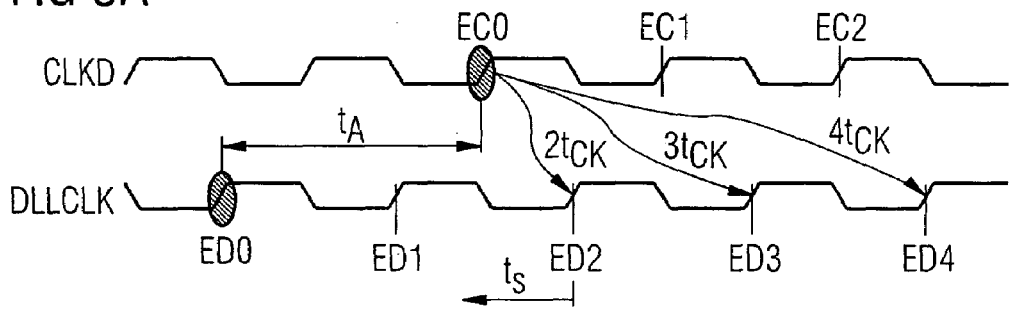
FIG. 3A shows a first timing diagram of two clock signals with a first CAS latency.
Figure 3B:
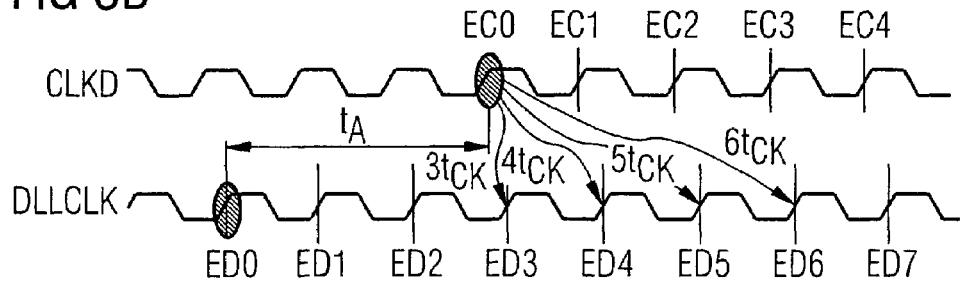
FIG. 3B shows a second clock diagram of two clock signals with a second CAS latency.
Figure 3C:
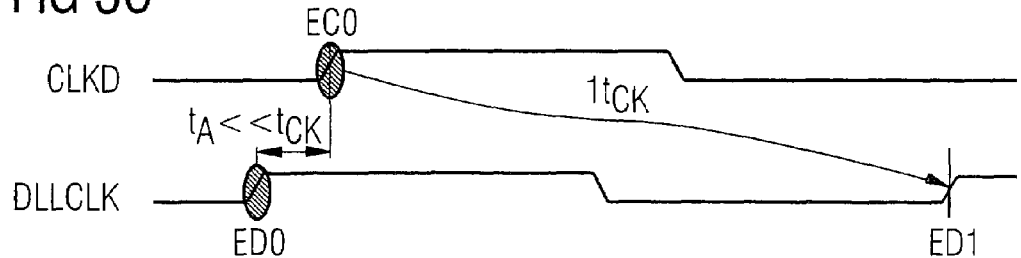
FIG. 3C shows a third clock diagram of two clock signals with a third CAS latency.
Figure 4:
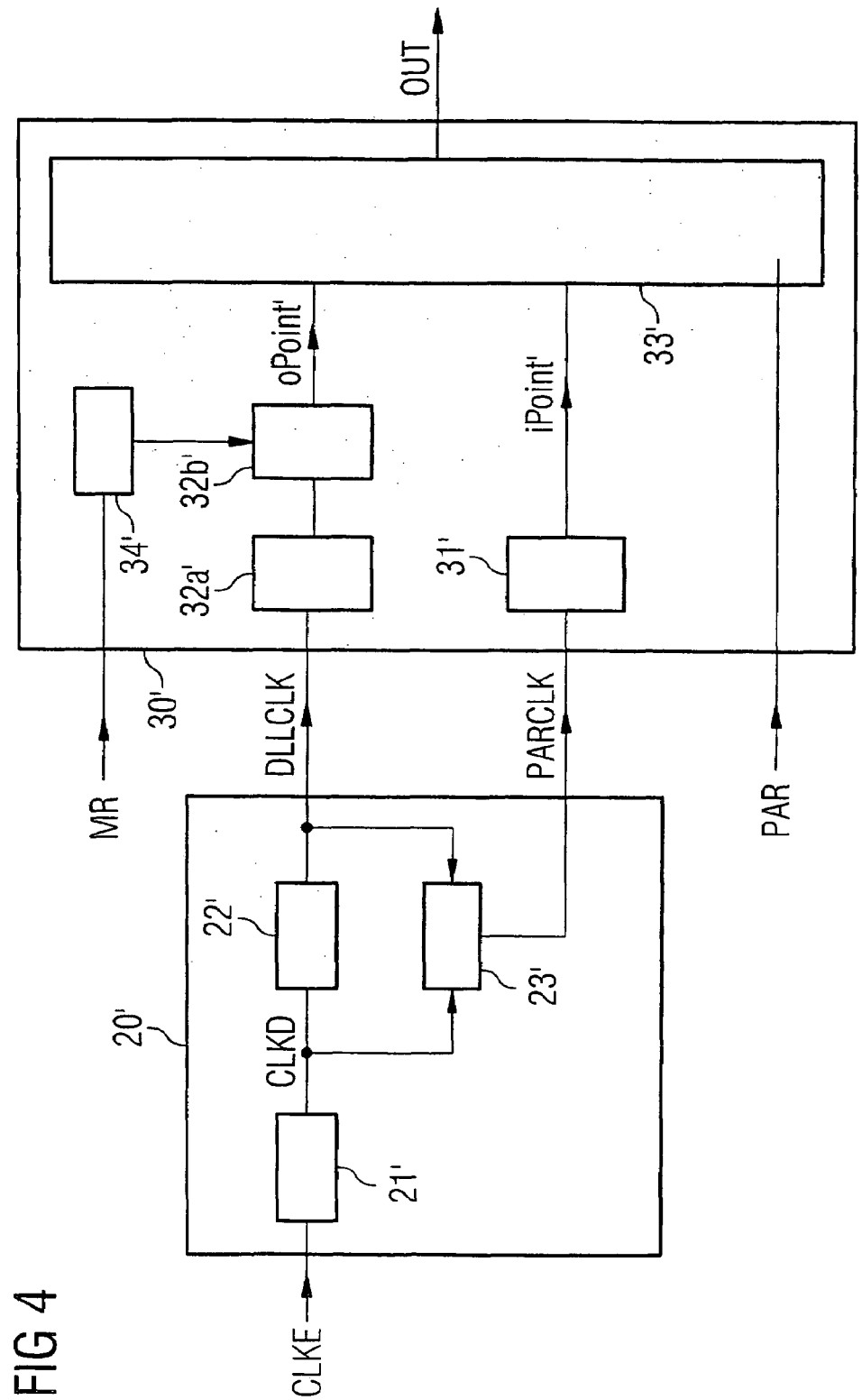
FIG. 4 shows an embodiment of a clock generating circuit and a latency counter circuit for synchronizing a data item with an externally applied clock signal according to a prior art design.

The external clock signal CLKE is applied to a clock terminal T100. A clock generating circuit 20 receives the external clock signal CLKE and generates two internal clock signals, a system clock signal CLKD and a DLL clock signal DLLCLK which runs "in advance" of the system clock signal CLKD. The clock generating circuit 20 comprises a clock receiver circuit 21 and a DLL circuit 22. The clock receiver circuit 21 receives the externally applied clock signal CLKE and generates the system clock signal CLKD as a first internal clock signal. As shown in FIGS. 3A to 3C, the system clock signal CLKD is delayed by a clock receiver delay time $t_{RCV}$ in relation to the external clock signal CLKE. The DLL circuit 22 generates, from the received system clock signal CLKD, a time-shifted internal DLL clock signal DLLCLK, which runs "in advance" of the system clock signal CLKD by the time shift $t_4$. As explained above in connection with FIG. 1, "running in advance"

means that data item DQ appears at data terminal IO100 substantially simultaneous with the marked edge of the external clock signal CLKE or substantially simultaneous with the marked edge of the system clock signal CLKD, if the time-shifted internal read command signal OUT, which is released from the latency counter circuit 30, actuates output circuit 50 at the marked edge of the DLL clock signal DLLCLK.

The control circuit 10 receives the system clock signal CLKD and generates the internal read command signal PAR in the system clock domain. The system clock signal CLKD and the DLL clock signal DLLCLK actuate latency counter circuit 30. In contrast to prior art solutions, as described for the latency counter circuit of a Graphic or a commodity DRAM, the latency counter circuit 30 of the present invention latches the internal read command signal PAR in the system clock domain and releases the time-shifted internal read command signal OUT in the DLL clock domain.

The integrated semiconductor memory device 100 is operated in a DLL ON mode or in a DLL OFF mode. The modes are activated externally by a mode signal MD applied to a control terminal S100c and are internally switched by an activation signal ACT. In the DLL ON mode, data items are generated at the data terminal IO100 synchronous with the clock cycles of the externally applied clock signal CLKE. In the DLL OFF mode, data items do not appear at the data terminal IO100 synchronous with the clock cycles of the externally applied clock signal CLKE.

Figure 6:
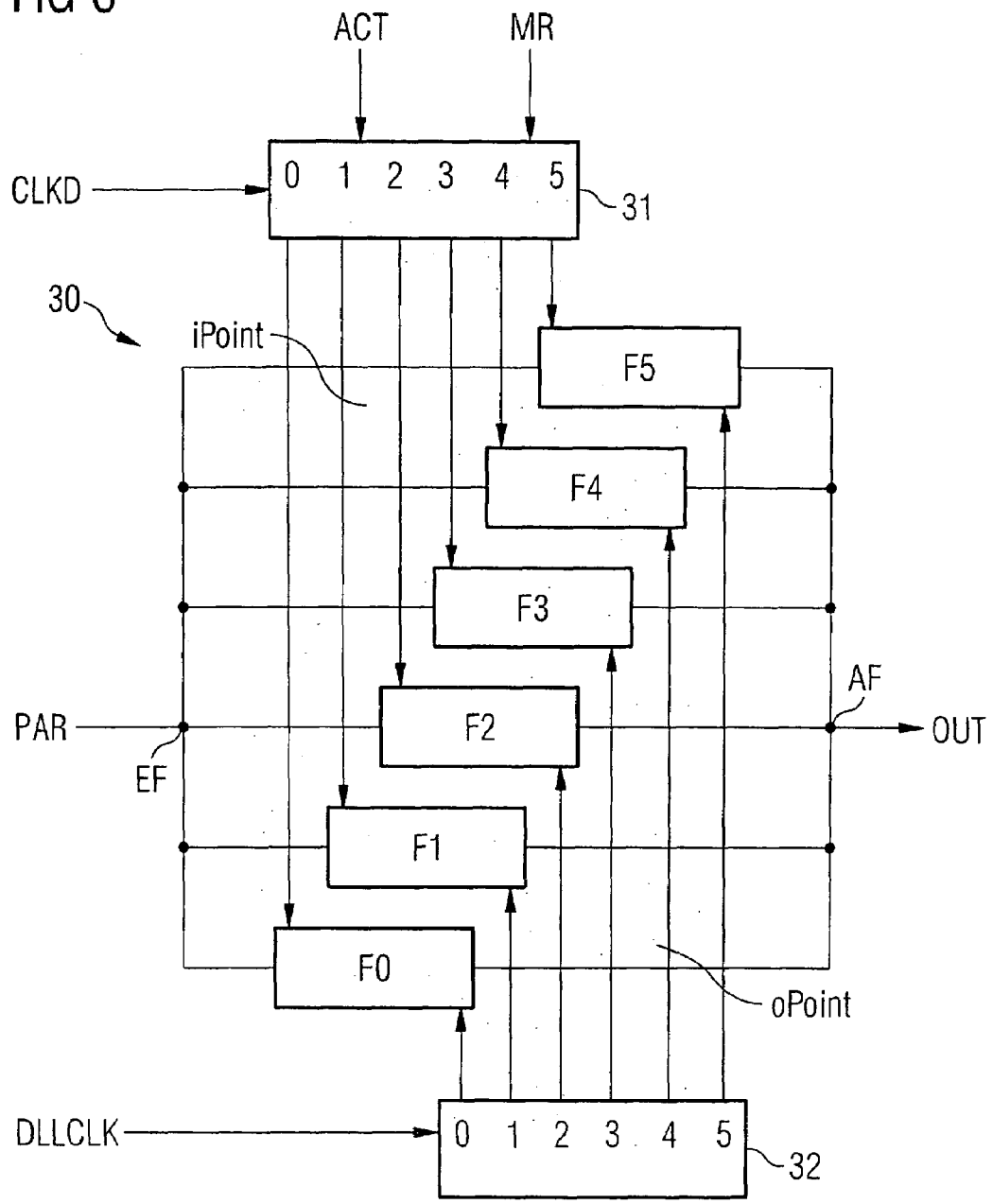
FIG. 6 shows a simplified schematic of a latency counter circuit according to the present invention.

FIG. 6 shows a simplified circuit diagram of a latency counter circuit according to the present invention. The latency counter circuit 30 synchronizes the internal read command signal PAR generated in the domain of the system clock signal CLKD into the domain of the DLL clock signal DLLCLK and delays the internal read command signal PAR by a certain number of clock cycles $t_{CK}$ depending on the configuration signal MR.

The latency counter circuit 30 comprises FIFO-latching cells F0–F5 to buffer the internal read command signal PAR. The latching of the internal read command signal PAR is controlled by a control signal iPoint generated by a control circuit 31. The control signal iPoint is triggered in the system clock domain by a clock signal derived from the system clock signal CLKD and internally generated inside the control circuit 31. The releasing of a latched internal read command signal PAR is controlled by a control signal oPoint generated from a control circuit 32. The control signal oPoint is triggered in the DLL clock domain directly synchronous with the DLL clock signal DLLCLK.

Each of the FIFO-latching cells is designed as a latch with a tri-state output. The tri-state output enables the latch of a FIFO-latching cell to release the latched internal read command signal PAR as time-shifted internal read command signal OUT only if it is driven by the control signal oPoint. Otherwise, the output has a high resistance. In each clock cycle of the DLL clock signal DLLCLK, only one of the FIFO-latching cells F0, . . . F5 releases the time-shifted internal read command signal OUT which was latched inside.

Due to the fact that the latching operation of each FIFO-latching cell and the releasing operation of each FIFO-latching cell are controlled by different control signals running in different clock domains, the internal read command signal PAR is stored irrespective of the state of the output of the FIFO-latching cell. The control circuits 31 and 32 comprise counter circuits designed as ring counters which continuously count from 0, . . . 5 according to the number of FIFO-latching cells, so that just one of the FIFO-latching cells F0, . . . , F5 is addressed for a latch or release access at a time. The free-running counters generate control signals iPoint and oPoint with special alignment, since the desired latency between applying the external read command signal RD and generating the corresponding data item at the data terminal IO100 is set by a proper alignment of the control signals iPoint and oPoint according to the desired CAS latency. In a preferred embodiment, ring counters are replaced by gray counters. Using gray counters has the advantage that these do not hang up under any conditions. Furthermore, no reset is necessary. Gray counters allow for easy glitch-free decoding.

The difference between the control signals iPoint and oPoint determines the latency of the latency counter circuit. FIG. 7 shows a state diagram of control signal iPoint running in the system clock domain and control signal oPoint running in the DLL clock domain. Control circuit 31 generates control signal iPoint with its states iPoint0, . . . , iPoint5 to latch the internal read command signal PAR in one of the FIFO-latching cells F0, . . . , F5. Control circuit 32 generates control signal oPoint with its states oPoint0, . . . , oPoint5 to release the buffered internal read command signal PAR from one of the FIFO-latching cells F0, . . . , F5. For reasons of simplicity, the states iPoint0–iPoint5 of control signal iPoint are generated by control circuit 31 synchronous with the system clock signal CLKD. The states oPoint0–oPoint5 of control signal oPoint are generated by control circuit 32 synchronous with the DLL clock signal DLLCLK.

Corresponding edges of the system clock signal CLKD and the DLL clock signal DLLCLK are marked. The DLL clock signal DLLCLK runs "in advance" of the system clock signal CLKD by the time shift $t_A$. The internal read command signal PAR is latched with every rising edge of the system clock signal CLKD independent from an active or inactive state. The state of the internal read command signal PAR is active when the control signal iPoint takes on the states iPoint0, iPoint1 and iPoint2 with a high level. Latching takes place for the first time synchronous with the falling edge of the control signal iPoint or the rising edge of the next system clock signal CLKD. Therefore, the internal read command signal PAR is latched with its active state in FIFO-latching cells F0 and F1, which are activated for latching by the control signal states iPoint0 and iPoint1. In contrast to latching, the releasing of the time-shifted internal read command signal OUT from a FIFO-latching cell is carried out synchronous with the rising edge of the control signal oPoint0. The time-shifted internal read command signal OUT is released from one of the FIFO-latching cells F0–F5 when the corresponding control signal states oPoint0–oPoint5 reach a high level.

As illustrated in the preceding Figures, edges of corresponding clock cycles in both clock domains are marked. Therefore, if a time-shifted internal read command signal OUT actuates output circuit 50 at clock cycle D0 of the DLL clock signal DLLCLK, data item DQ is generated at data terminal IO100 at clock cycle C0 of the system clock signal CLKD. Therefore, no latency is given if the internal read command signal PAR is generated and latched at clock cycle C0 of the system clock signal CLKD and if the time-shifted internal read command signal OUT has already actuated the output circuit 50 "in advance" at the marked rising edge ED0 or within corresponding clock cycle D0 of the DLL clock signal DLLCLK. However, substantially simultaneous with the marked rising edge EC0 of the system clock signal CLKD, control signal state iPoint0 changes from a low to a high level to latch internal read command signal PAR in FIFO-latching cell F0. Therefore, if a latency of 0 clock cycles is to be obtained, control signal state oPoint0 has to change from a low to a high level at the marked edge or within corresponding clock cycle D0 of the DLL clock signal DLLCLK in order to release time-shifted internal read command signal OUT and to actuate output circuit 50. Based on the state of control and clock signals in FIG. 7, control signal state oPoint0 is shifted four clock cycles back from its present position, i.e. from clock cycle D4 to clock cycle D0, of the DLL clock signal DLLCLK, in order to obtain a latency of 0. Since the change of state of control signal state oPoint0 actually takes place during clock cycle D4, the latency illustrated in FIG. 6 is equal to four clock cycles, or the CAS latency equals five because of the additional one clock for preamble generation.

The use of hold latches for latching the internal read command signal PAR improves the operation of the latency counter circuit and extends the operating range as long as minimal requirements are not violated. In order to make the synchronization possible, it is required that the signal which should be synchronized, for example the internal read command signal PAR, be valid for a setup time $t_s$, as shown in FIG. 3A, before the target rising clock edge of the destination clock domain, for example the DLL clock domain. However, according to the present invention, it is possible that the active phases of control signals iPoint and oPoint overlap. With this improvement, a smaller delay/latency can be used for the synchronization, or a greater time shift $t_A$ is supported with the same latency. The corresponding FIFO-latching cell is then transparent, and the released output is not yet latched. This extends the operation range of the latency counter circuit by less than one clock cycle. A further time shift would cause glitches on the output and finally complete failure.

In order to synchronize the time-shifted internal read command signal OUT with a rising edge of the DLL clock signal DLLCLK such that the desired latency is obtained, control signals iPoint and oPoint must be properly aligned to each other. This can be accomplished with a latency counter circuit 30 according to the embodiment shown in FIG. 8. A latch circuit 33 comprises FIFO-latching cells F0–F5. The latency counter circuit 30 comprises a control circuit 31 for generating the control signal iPoint and a control circuit 32 for generating the control signal oPoint. The control circuit 31 drives the latch circuit 33 with the control signal iPoint in the system clock domain synchronous with an internally generated internal clock signal CLKIP derived from the system clock signal CLKD.

Control circuit 31 comprises a counter circuit 310 for generating a counter signal iCount, a shift register 311 for generating a time-shifted counter signal iCount', a latch 312 for generating the control signal iPoint, a delay/clock circuit 313, and a decoder circuit 314. Control circuit 32 comprises a counter circuit 320 for generating a counter signal oCount, a shift register 321 for generating the control signal oPoint, and a latch 322 for generating an internal control signal SHIFT.

Figure 9A:
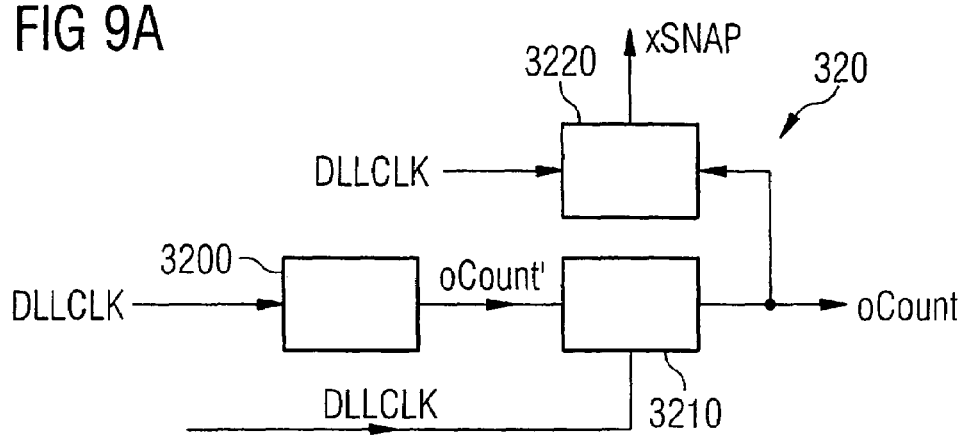
FIG. 9A shows an embodiment of a control circuit according to the present invention.
Figure 9B:
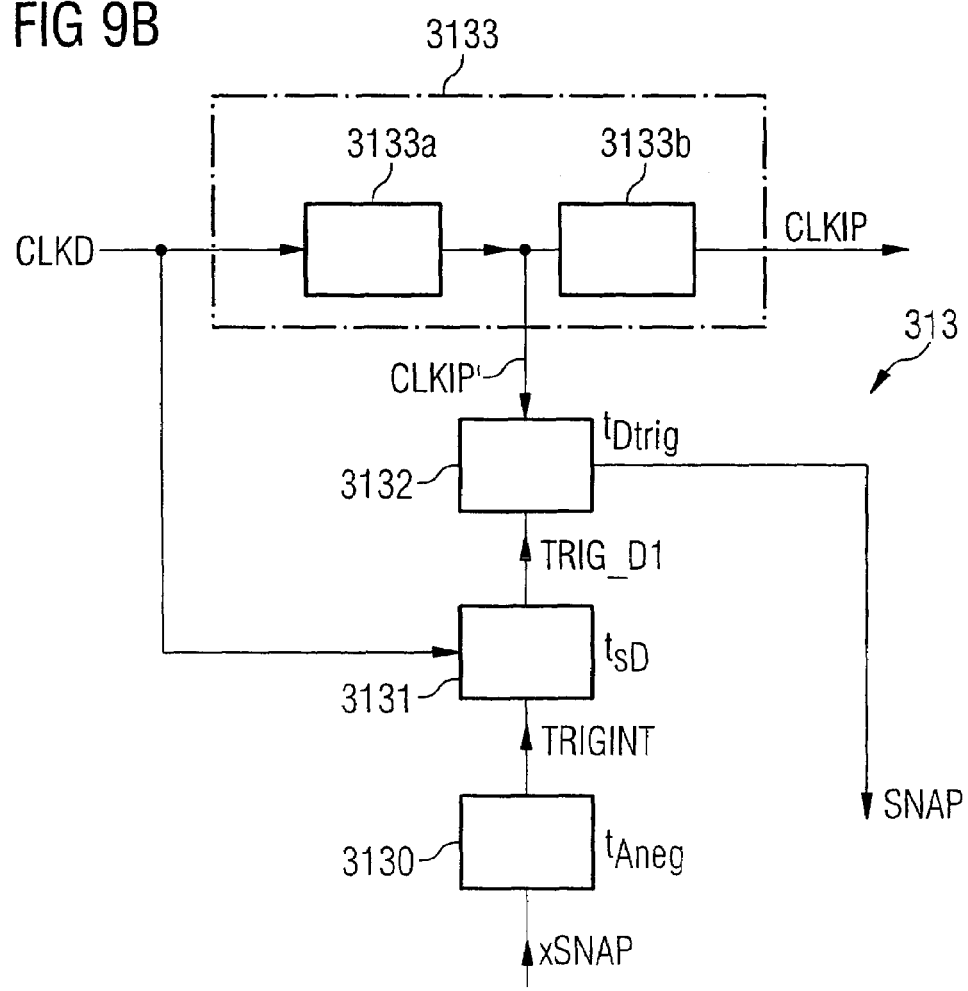
FIG. 9B shows an embodiment of a delay/clock circuit of the control circuit according to the present invention.
Figure 10:
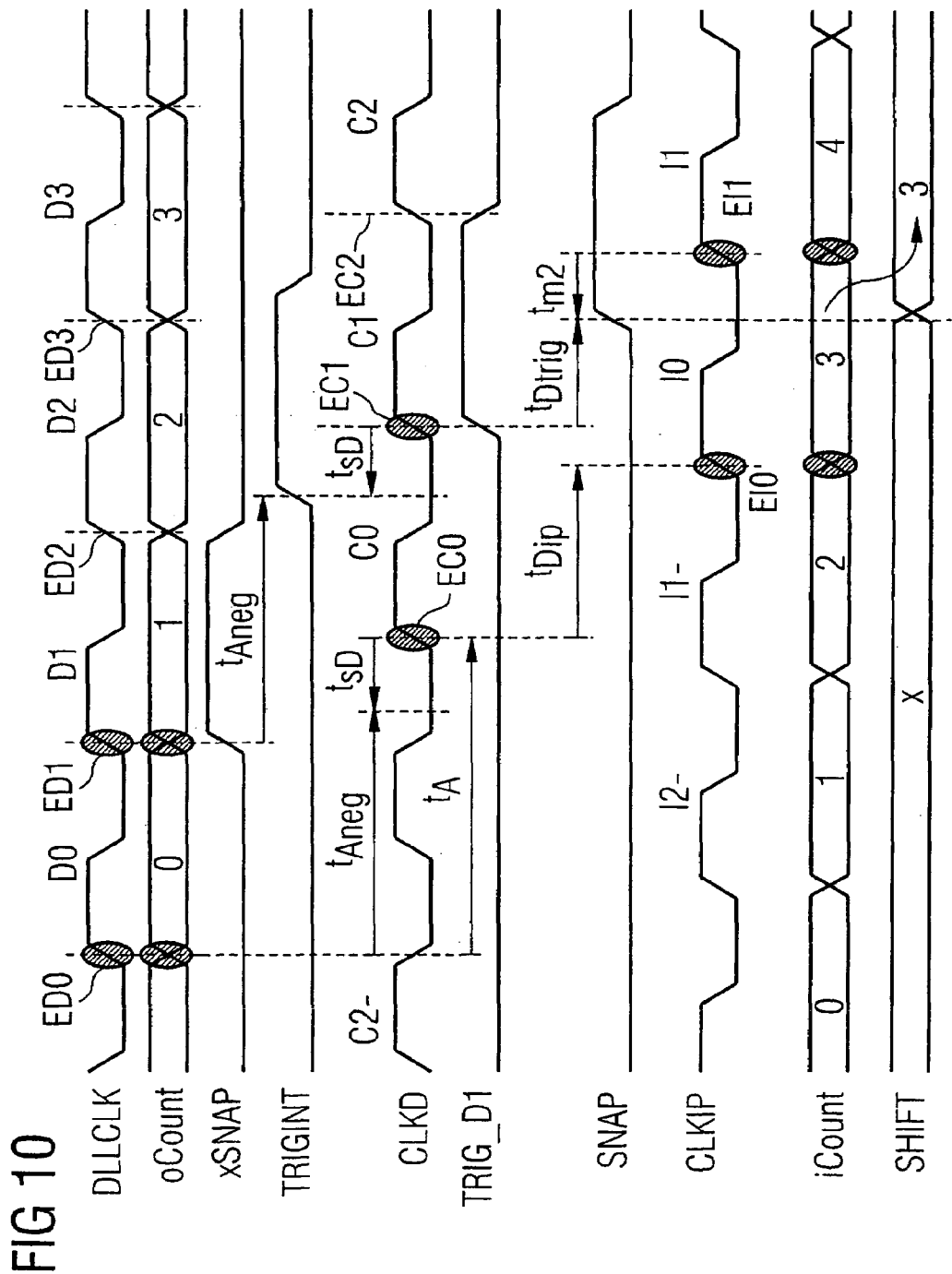
FIG. 10 shows a timing diagram of clock and control signals of the latency counter circuit according to the present invention.

The operation of the latency counter circuit 30 is described in connection with FIGS. 8, 9 and 10. FIG. 10 shows a timing diagram of clock signals DLLCLK, CLKD and CLKIP, internal control signals xSNAP, TRIGINT, TRIG_D1, SNAP and SHIFT, and counter signals iCount and oCount. The DLL clock signal DLLCLK runs "in advance" of the system clock signal CLKD by the shift time $t_A$, as illustrated before. All clock signals have a clock cycle period of a time $t_{CK}$. Corresponding edges of clock signals DLLCLK, CLKD and CLKIP, as well as corresponding edges of counter signals oCount and iCount, are highlighted.

Counter circuit 320 is driven by the DLL clock signal DLLCLK. According to FIG. 9A, counter circuit 320 comprises a free-running counter 3200, a latch 3210, and a control circuit 3220, which are all triggered from the DLL clock signal. DLLCLK Free-running Counter 3200 preferably counts in gray code. Gray code is used because of glitch-free transitions. In the example according to FIG. 10, free-running counter 3200 continuously and repeatedly outputs counter signal oCount' with states running from 0–5. Counter signal oCount' does not have precise timings. In order to obtain better timing, counter signal oCount' is latched in latch 3210 synchronous with DLL clock signal DLLCLK. The latch 3210 supplies counter signal oCount with states running continuously and repeatedly from 0–5 synchronous with DLL clock signal DLLCLK, as shown in FIG. 10. Control circuit 3220 generates internal control signal xSNAP when counter signal oCount changes its state from "0" to "1". Therefore, internal control signal xSNAP represents counter state "1".

In the next step, internal control signal xSNAP is delayed to transfer it from the DLL clock domain into the system clock domain. For this purpose, internal control signal xSNAP is transmitted to delay/clock circuit 313. An embodiment of delay/clock circuit 313 is shown in FIG. 9B. Delay/clock circuit 313 comprises a delay circuit 3130, a latch 3131 and a latch 3132. A latch circuit 3133 comprising a delay stage 3133a and a delay stage 3133b receives the system clock signal CLKD and generates an internal clock signal CLKIP which is delayed with regard to the system clock signal CLKD by a time shift $t_{Dip}$. Internal Control signal xSNAP is delayed in the delay circuit 3130 by a predetermined time shift $t_{Aneg}$. The time shift $t_{Aneg}$ is shorter than the time shift $t_A$ by a time margin for latching and setup $t_{sD}$. The best value for this time margin is half the minimum clock cycle $t_{CKmin}$. The delay circuit 3130 outputs internal control signal TRIGINT.

To fulfill the clock mapping, control signal TRIGINT is buffered in latch 3131, which is driven synchronously with system clock signal CLKD. The latch 3131 supplies internal control signal TRIG_D1 synchronous with the system clock signal CLKD. At this moment, the mapping of the clock domains is carried out.

However, further steps are necessary to determine the counter state of the counter circuit 310 corresponding to the counter state "1" of the counter circuit 320. As shown in FIG. 8, the counter circuit 310 is not driven by the system clock signal CLKD, but runs synchronous with the internal clock signal CLKIP. Since the internal clock signal CLKIP is delayed by the aforementioned time shift $t_{Dip}$ with regard to the system clock signal CLKD, internal control signal TRIG_D1 is latched again in latch 3132 and supplied with a delay time $t_{Dtrig}$ with regard to internal control signal SNAP. In order to obtain the internal control signal SNAP by a margin/hold time $t_{m2}$ before a highlighted rising edge of the internal clock signal CLKIP, latch 3132 is triggered by a clock signal CLKIP' generated by the delay stage 3133a. Therefore, the delay time $t_{Dtrig}$ is shorter than the time shift $t_{Dip}$ by the margin/hold time $t_{m2}$. Latch 3132 may also be designed as a register.

The state of the counter signal iCount in the clock cycle 10 of the internal clock signal CLKIP which corresponds to the state "0" of the counter signal oCount in the corresponding clock cycle D0 of the DLL clock signal DLLCLK is latched via latch 322 by the rising edge of the internal control signal SNAP. Since the time shift $t_{Dtrig}$ is shorter than the time shift $t_{Dip}$, it is ensured that the state of counter signal iCount between the highlighted edges of the clock cycle 10 of the internal clock signal CLKIP corresponds to the state of the counter signal oCount between the highlighted edges of the cycle D0 of the DLL clock signal DLLCLK.

With the rising edge of the internal control signal SNAP, the current state of counter signal iCount is latched in latch 322. Latch 322 is formed as a vector of flip-flops. They are used to hold the control signal dependency information between single adjust pulses of the internal control signal SNAP. Therefore, the state of latch 322 shows the discrepancy between corresponding counter signals iCount and oCount. This discrepancy is indicated by the internal control signal SHIFT.

Control signal SHIFT is supplied from latch 322 and driven to shift register 321. Shift register 321 is preferably designed as a barrel shifter. A barrel shifter is able to asynchronously shift all state vectors of counter signals oCount by a given number of clock cycles $t_{CK}$. In the example shown in FIG. 10, counter state "3" of counter signal iCount is latched in latch 322 by the rising edge of internal control signal SNAP. As explained according to FIG. 7, a latency of 0 is obtained, when at a clock cycle of the clock signal in the system clock domain and at a corresponding clock cycle in the DLL clock domain, control signals or, counter signals, according to FIG. 10, take on the same state. Then, the counter signals of both clock domains are properly aligned with a latency of 0. To align the counter signals iCount and oCount, the barrel shifter 321 therefore shifts counter signal oCount depending on the internal control signal SHIFT, as shown in FIG. 10, by three clock cycles $t_{CK}$, such that both counter signals take on the same state at corresponding/highlighted clock cycles. The shifted counter signal oCount represents the control signal oPoint to release the buffered internal read command signal PAR from FIFO-latching cells F0–F5 included in latch circuit 33.

The great number of time shifts and control signals are used for operation safety. Creating a consecutive delay in two small pieces is more advantageous than realizing the delay between the DLL clock signal DLLCLK and the internal clock signal CLKIP as one piece. The mapping of both clock domains is carried out at as early as possible for timing variation reasons. The time shift $t_{Aneg}$ is kept as small as possible to eliminate any stochastic or systematic mismatches, so that a great margin is provided for alignment of DLL clock signal DLLCLK and system clock signal CLKD, which depends on the alignment of the DLL circuit.

The decoder circuit 314 is driven by the configuration signal MR and generates internal control signal MR'. Internal control signal MR' indicates the number of clock cycles $t_{CK}$ the counter signal iCount is shifted to create the desired CAS-latency. For this purpose, shift register 311 is provided. Shift register 311 is designed as a barrel shifter to asynchronously shift whole state vectors of counter signal iCount by a given number of clock cycles $t_{CK}$. Shift circuit 311 works statically. If CAS latency is increasing, it shifts the counter signal iCount backwards in relation to the state when counter signal iCount is properly aligned. After having shifted all state vectors of counter signal iCount, shift circuit 311 outputs shifted counter signal iCount'.

Latch 312 is driven by the shifted control signal iCount'. Latch 312 represents a vector of flipflops. They are used to improve the timing precision of the control signal iPoint generated by latch 312. This is possible only if an additional stage of flipflops is implemented. It causes an additional time shift of one clock cycle. This additional shift generates states of control signal iPoint with a good precision for latching the internal read command signal PAR.

Control signal iPoint with its states iPoint0–iPoint5 and control signal oPoint with its states oPoint0–oPoint5 are transmitted to latch circuit 33. The latch circuit 33 comprises FIFO-latching cells with tri-state outputs AF, as shown in FIG. 6. All inputs EF of the FIFO-latching cells are connected to each other, and the outputs AF of all FIFO-latching cells are also connected to each other.

Two flipflops 34 and 35 are connected to the output terminal A33 of latch circuit 33 and operate synchronous with the DLL clock signal DLLCLK. The time-shifted internal read command signal OUT is driven to flipflop 34, which generates control signal OUTENm1. Control signal OUTENm1 represents a preamble trigger signal. Flipflop 34 supplies flipflop 35 with control signal OUTENm1. Flipflop 35, also operates synchronous with the DLL clock signal DLLCLK, supplies a control signal OUTENm0 representing a data trigger signal.

Figure 11A:
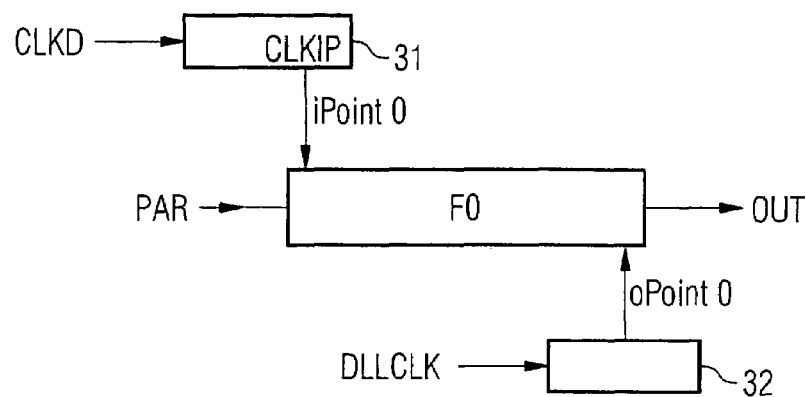
FIG. 11A shows an embodiment of a latency counter circuit according to the present invention.
Figure 11B:
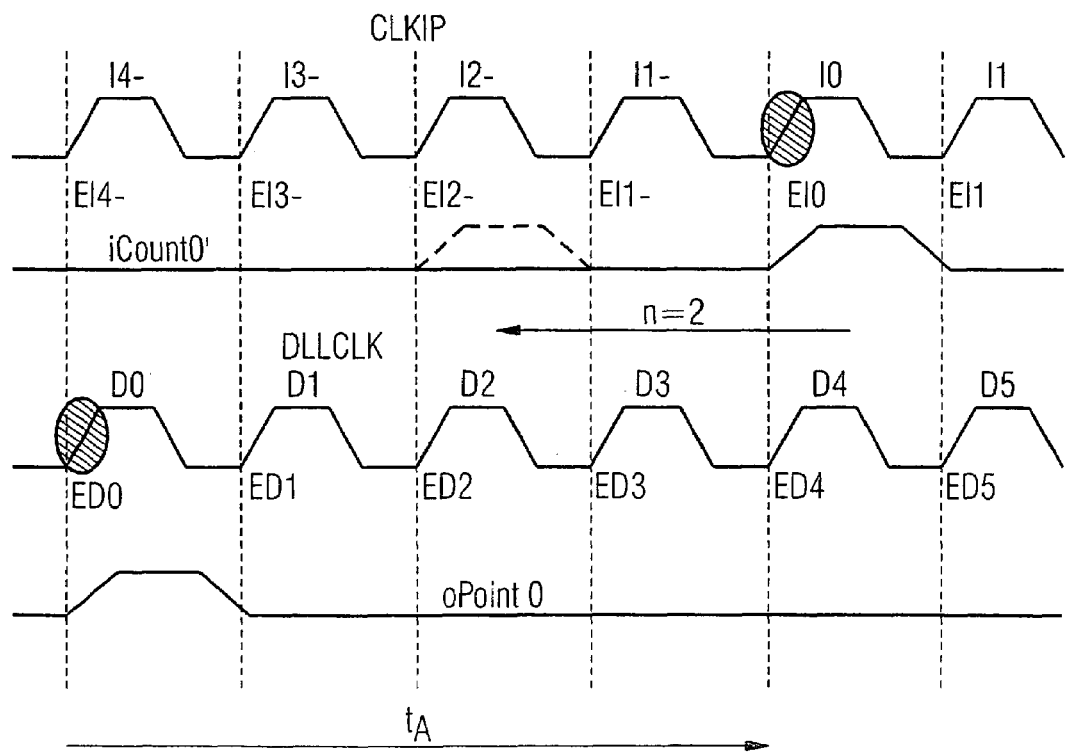
FIG. 11B shows a timing diagram of clock and control signals of the latency counter circuit according to the present invention.

FIGS. 11A and 11B illustrate the described method for shifting the states iPoint0–iPoint5 of control signal iPoint depending on the desired CAS latency. FIG. 11A shows, for reasons of simplicity, a single FIFO-latching cell F0. A latch operation is controlled by control signal state iPoint0 generated by control circuit 31. Control circuit 31 operates in the system clock domain. The buffered internal read command PAR is released as time shifted internal read command signal OUT, if control signal state oPoint0 actuates FIFO-latching cell F0.

FIG. 11B shows a timing diagram of the state iCount0' of the counter signal iCount and the state oPoint0 of control signal oPoint. The state iPoint0 is generated synchronous with the internal clock signal CLKIP, whereas state oPoint0 is generated synchronous with DLL clock signal DLLCLK. The full lines of the states iPoint0 and oPoint0 show the constellation for the case that both control signals are properly aligned. For this purpose, shift register 321 shifts counter signal oCount such that, at the marked edges and their appropriate clock cycles 10 and D0, control signals iPoint and oPoint both show the same change from a state iPoint0/oPoint0 to a state iPoint1/oPoint1. The desired CAS latency is obtained by a shift of the states of the counter signal iCount. This is carried out in the shift register 311. In the example according to FIG. 11B, the control signal state iPoint0 is shifted by the shift register 311 by 2 clock cycles backwards, obtaining a latency of 2.

Besides the described method, there are many ways of implementing the calculated shifts of the control signals. However, the use of two different barrel shifters offers major advantages. CAS latency shift is applied almost instantly within one clock cycle and without changes in counter alignment. The control signals iPoint and most register signals are generated in the system clock domain.

The counter alignment is implemented in control circuit 32 for timing reasons. In a system with a DLL circuit, after clock switching, the DLL clock signal DLLCLK is available for a significantly long time after the system clock signal CLKD. The internal read command signal PAR might have to be latched before the DLL clock signal DLLCLK is available. With the shift of counter signal oCount, it is possible to latch the internal read command signal PAR before the DLL clock signal DLLCLK is available and control signals iPoint and oPoint are adjusted. Furthermore, a very fast alignment after a power down exit is possible. The clock receiver for receiving the external clock signal CLKE can be turned off even in an active power down mode.

Figure 12:
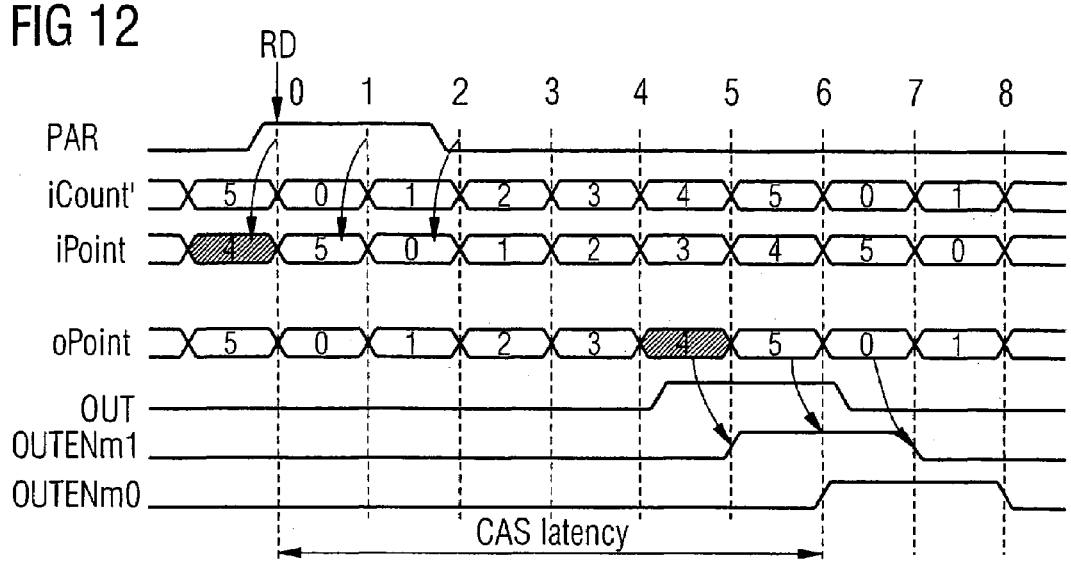
FIG. 12 shows an idealized timing diagram of control and command signals of the latency counter circuit according to the present invention.

In FIG. 12, an idealized timing diagram with a CAS latency of six is shown. The internal read command signal PAR is placed with enough setup time for latching. Because of the additional flipflop latching stage 312, control signal iPoint is delayed by one clock cycle relative to the shifted counter signal iCount'. As indicated by the arrow, internal read command signal PAR is latched in FIFO-latching cells 4 and 5 with an active state and released from FIFO-latching cells 4 and 5 as time-shifted internal read command signal OUT. In FIG. 12, the alignment of the control signals is equal to an alignment without a CAS-latency. Therefore, counter signal iCount corresponds to control signal iCount'. The time-shifted internal read command signal OUT is drawn with some delay to the control signal oPoint to indicate some hold time for latching the preamble trigger signal OUTENm1.

Without the latency shift, the control signals are set in such a way, that the resulting latency is six. This is equal to a counter overflow. Therefore, with a CAS-latency of six, no latency shift is used.

To set a lower latency, the counter signals oCount are shifted to a higher number (accelerated), or the counter signals iCount are shifted to a lower number (delayed).

Up to now the operation of the latency counter circuit has been described in a DLL ON mode. In the DLL ON mode, the latency counter circuit is driven by a first state of control signal ACT. In the DLL ON mode, the latency counter circuit ensures that data items DQ are generated at data terminal IO100 synchronous with the edges of the external clock signal CLKE. To activate a DLL OFF mode, the latency counter circuit is driven by a second state of control signal ACT. In the DLL OFF mode, data items DQ are not outputted synchronous with the external clock signal CLKE.

Figure 13:
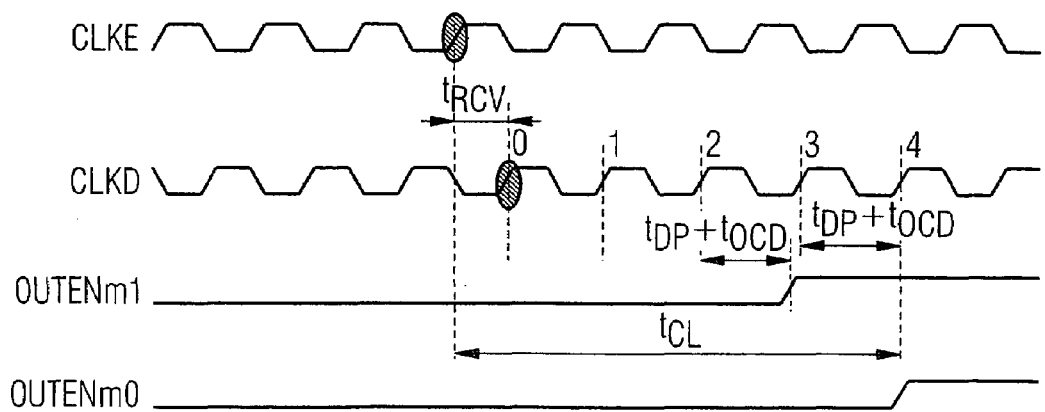
FIG. 13 shows a first timing diagram of clock and control signals in a DLL OFF mode of the latency counter circuit according to the present invention.

FIG. 13 shows a signal timing diagram in the DLL OFF mode of the integrated semiconductor memory. By applying the same CAS-latency value of the configuration signal MR, in the DLL OFF mode, the result is a delay which is one clock cycle $t_{Ck}$ smaller than in the DLL ON mode, but with an additional constant delay. In contrast, the timing in the DLL ON mode has no constant delay but a constant number of clock cycles. To get the right timing in the DLL OFF mode, only the mapping scheme is changed. The CAS-latency decoding is carried out in all modes in a similar fashion. When the DLL circuit is running, the internal control signal xSNAP is delayed by the time shift $t_{Aneg}$ such that the internal control signal TRIGINT becomes active prior to the rising edge of the system clock signal CLKD. In the DLL OFF mode, internal control signal TRIGINT becomes active after the rising edge of the system clock signal CLKD. This reduces the executed CAS latency by one step.

The switching between negative and positive margins is carried out in the clock/delay circuit 313. When the delay lock loop is turned off, the large time shift $t_A$ is reduced to zero or takes on a negative value. In this case, the used delay also increases, but it does so less than in the DLL ON mode. This difference results in the fact that the internal control signal TRIGINT becomes active after the rising edge of the system clock signal CLKD.

Figure 14:
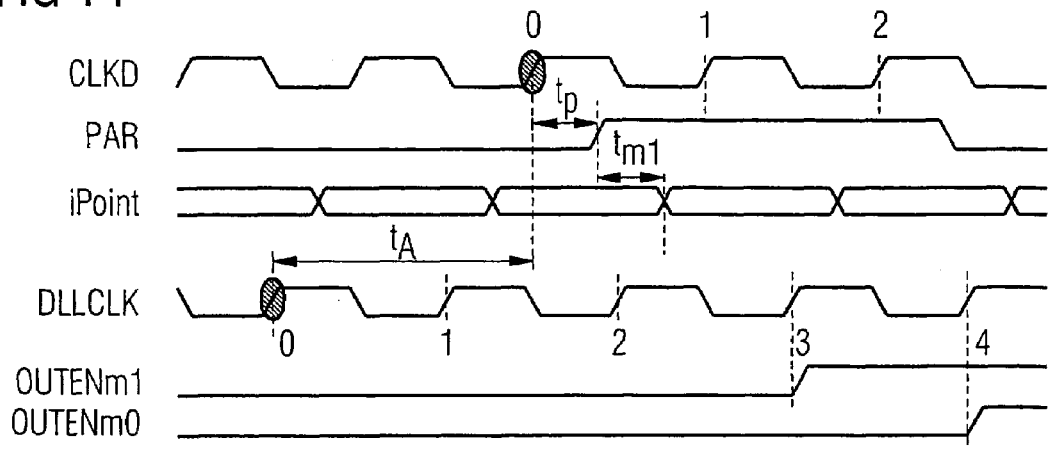
FIG. 14 shows a timing diagram of clock and control signals in a DLL ON mode according to the present invention.

FIG. 14 shows a signal timing diagram in the DLL ON mode of the integrated semiconductor memory. When the DLL circuit is turned on, the specific time shift $t_A$ between the DLL clock signal DLLCLK and the system clock signal CLKD is about 4 ns. This number is by definition constant for all frequencies. In the current design, the internal read command signal PAR is delayed by a delay time $t_p$ of about 2 ns relative to the system clock signal CLKD. To make the latching of the internal read command signal PAR as safe as possible, the latching point is set with maximum possible margin. In this case, the margin is 0.5 of the minimum clock cycle $t_{CK}$ ($t_{m1}$=1.25 ns). Therefore, the time shift between the system clock signal CLKD and the latching point of the internal read command signal PAR is about 3.25 ns. The preamble trigger signal OUTENm1-DQS-enable trigger—is activated one clock cycle prior to the data trigger signal OUTENm0—the selected CAS latency. In FIG. 14, a CAS-latency of four is shown.

Figure 15:
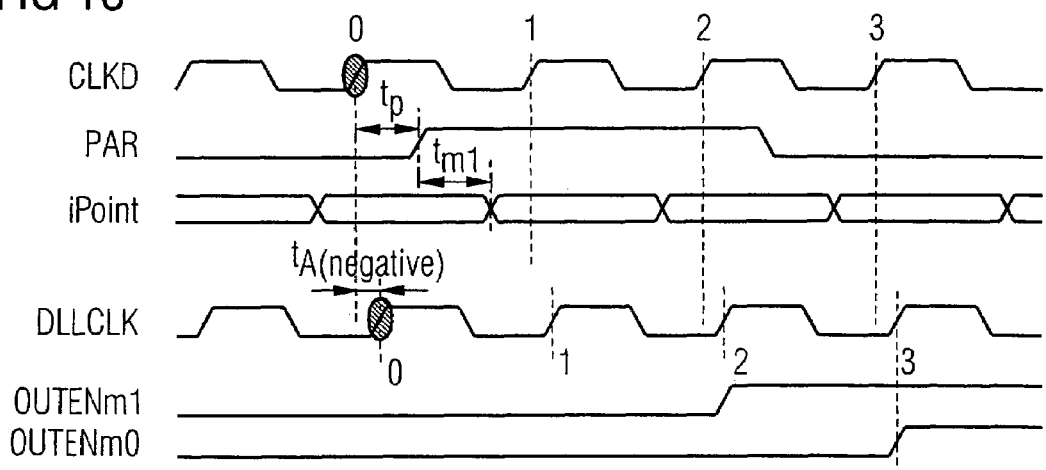
FIG. 15 shows a second timing diagram of clock and control signals in a DLL OFF mode according to the present invention.

FIG. 15 shows a signal timing diagram in the DLL OFF mode of the integrated semiconductor memory. The DLL OFF mode is not designed for very high frequencies. In this mode, the chip is running in just one clock domain, because the DLL clock signal DLLCLK is derived from the system clock signal CLKD and has no lead time to the system clock signal CLKD. Due to this fact, the output signal timings are different compared to the DLL ON mode. Because of the missing lead time, the preamble trigger signal OUTENm1 and the data trigger signal OUTENm0 are activated one clock cycle $t_{CK}$ earlier than in the DLL ON mode. Setting the A CAS-latency to four results in a latency of three. The data items DQ are not aligned to the external clock signal. In the DLL OFF mode, some of the timings are the same as in the DLL ON mode. The latching point of the internal read command signal PAR is chosen in the same place, i.e., 0.5 clock cycles after the internal read command signal PAR changes. The very important difference between the two modes is that the DLL clock signal DLLCLK is not running ahead of the system clock signal CLKD, but delayed relative to it. The timing dependency is constant in both directions.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

| Reference Symbols | |
|---|---|
| 10 | control circuit |
| 20 | clock generating circuit |
| 21 | clock receiver |
| 22 | DLL circuit |
| 23 | DLL feedback circuit |
| 30 | latency counter circuit |
| 31 | first control circuit |
| 32 | second control circuit |
| 33 | latch circuit |
| 34, 35 | flipflops |
| 40 | memory cell array |
| 100 | integrated semiconductor memory device |
| 310 | counter circuit |
| 311 | shift register |
| 312 | latch |
| 313 | delay/clock circuit |
| 314 | decoder |
| 320 | counter circuit |
| 321 | shift register |
| 322 | latch |
| 3130, . . . , 3132 | delay components |
| 3133 | receiver circuit |
| 3200 | free-running counter |
| 3210 | latch circuit |
| 3220 | control circuit |
| ACT | activation signal |
| AT | selection transistor |
| BL | bitline |

-continued

| Reference Symbols | |
|---|---|
| CLKD | system clock signal |
| CLKE | external clock signal |
| CLKI | internal clock signal |
| DLLCLK | time-shifted DLL clock signal |
| DQ | data item |
| F | FIFO-latching cell |
| iCount | counter signal |
| IO | data terminal |
| iPoint | first control signal |
| MR | configuration signal |
| oCount | counter signal |
| oPoint | second control signal |
| OUT | time-shifted internal read command signal |
| OUTENm0 | data trigger signal |
| OUTENm1 | preamble trigger signal |
| PAR | internal read command signal |
| RD | external read command signal |
| SC | memory cell |
| SC | storage capacitor |
| t | time shift |
| WL | wordline |

What is claimed is:

1. Integrated semiconductor memory device for synchronization of signals with a clock signal, comprising:
   a clock generating circuit configured to generate a first clock signal and a second clock signal that is time-shifted with respect to the first clock signal;
   a first control circuit configured to generate a first control signal and to generate an internal clock signal that is delayed relative to the first clock signal, wherein the first control circuit generates the first control signal synchronous with the internal clock signal at a point in time that is dependent on a received configuration signal;
   a second control circuit configured to generate a second control signal synchronous with the second clock signal; and
   a latch circuit configured to latch a first command signal and release a second command signal, the latch circuit latching the first command signal synchronous with the internal clock signal in response to the latch circuit being actuated by the first control signal and releasing the second command signal synchronous with the second clock signal in response to the latch circuit being actuated by the second control signal.

2. The integrated semiconductor memory device as claimed in claim 1, wherein:
   the clock generating circuit receives an external clock signal and generates the first and second clock signals such that the first and second clock signals each have a frequency dependent on a frequency of the external clock signal, wherein the first clock signal is delayed relative to the external clock signal by a first delay time;
   the integrated semiconductor memory device further comprising:
   a third control circuit which receives an external command signal that is synchronous with the external clock signal, the third control circuit generating the first command signal synchronous with the first clock signal after being actuated by the external command signal.

3. The integrated semiconductor memory device as claimed in claim 1, further comprising:
   at least one memory cell to store a data item;
   an output circuit for buffering the data item and for providing the data item to a data terminal, wherein:
   the memory cell is activated for a read access in response to the external command signal being received;
   during the read access, the data item is supplied from the memory cell to the output circuit for buffering the data item; and
   the output circuit supplies the data item to the data terminal after a second delay time after being actuated by the second command signal.

4. The integrated semiconductor memory device as claimed in claim 1, wherein the first clock signal is supplied to the first control circuit, and the second clock signal is supplied to the second control circuit.

5. The integrated semiconductor memory device as claimed in claim 3, wherein:
   the clock generating circuit generates an edge of a first clock cycle of the second clock signal time shifted with respect to an edge of a first clock cycle of the first clock signal by a first time shift that is equal to a sum of the first and second delay time;
   the first control circuit generates an edge of a first clock cycle of the internal clock signal delayed with respect to the edge of the first clock cycle of the first clock signal by a second time shift having a duration of at least a processing time of the third control circuit, and the processing time being equal to a duration between the edge of the first clock cycle of the first clock signal and the point in time where the first control signal is generated by the third control circuit;
   the first control circuit is configured such that a state of the first control signal is shifted by a number of clock cycles of the internal clock signal in relation to the first clock cycle of the internal clock signal, wherein the number of clock cycles is dependent on the configuration signal; and
   the second control circuit generates the second control signal at the first clock cycle of the second clock signal.

6. The integrated semiconductor memory device as claimed in claim 4, wherein:
   the first control circuit includes a counter circuit for generating a first counter signal, a shift register for generating a time shifted first counter signal, a latch for generating the first control signal and a delay/clock circuit;
   the first clock signal is supplied to the clock/delay circuit;
   the configuration signal is supplied to the shift register;
   the delay/clock circuit generates the internal clock signal derived from the first clock signal;
   the internal clock signal is supplied to the counter circuit;
   the counter circuit generates the first counter signal synchronous with the internal clock signal;
   the first counter signal is supplied to the shift register;
   the shift register generates the time shifted first counter signal synchronous with the internal clock signal, wherein a state of the time shifted first counter signal is shifted by a number of clock cycles of the internal clock signal in relation to the first clock cycle of the internal clock signal;
   the latch is actuated by the time shifted first counter signal and the internal clock signal; and
   the latch generates the first control signal synchronous with the internal clock signal.

7. The integrated semiconductor memory device as claimed in claim 6, wherein:
   the second control circuit includes a counter circuit for generating a second counter signal and a shift register for generating the second control signal;

the counter circuit of the second control circuit is actuated by the second clock signal;

the counter circuit of the second control circuit generates the second counter signal synchronous with the second clock signal;

the second counter signal is supplied to the shift register of the second control circuit;

the shift register of the second control circuit generates the second control signal synchronous with the second clock signal, wherein a state of the second counter signal is shifted by a number of clock cycles of the second clock signal to the first clock cycle of the second clock signal.

8. The integrated semiconductor memory device as claimed in claim 7, wherein:

the second control circuit further includes a latch for generating a first internal control signal;

the latch of the second control circuit is actuated by the first counter signal;

the latch of the second control circuit generates a state of the first internal control signal which indicates a state of the first counter signal at the first clock cycle of the internal clock signal; and the first internal control signal is supplied to the shift register of the second control circuit.

9. The integrated semiconductor memory device as claimed in claim 8, wherein:

the first control circuit includes the delay/clock circuit for generating a second internal control signal;

the second control circuit includes the counter circuit for generating a third internal control signal;

the third internal control signal is supplied to the delay/clock circuit of the first control circuit;

the counter circuit of the second control circuit generates the third internal control signal when a change of state of the second counter signal is generated by the counter circuit of the second control circuit;

the delay/clock circuit of the first control circuit generates a first state of the second internal control signal at the first clock cycle of the internal clock signal;

the latch of the second control circuit is supplied with the second internal control signal;

the latch of the second control circuit generates the first internal control signal with the state of the first internal control signal which indicates the state of the first counter signal when the second internal control signal takes on the first state.

10. The integrated semiconductor memory device as claimed in claim 9, wherein:

the delay/clock circuit of the first control circuit includes a delay circuit, a first latch, and a second latch for generating the second internal control signal;

the delay circuit and the latch circuits are configured such that they delay the third internal control signal by the first time shift to synchronize the third internal control signal with the first clock signal and afterwards delay the third internal control signal by a third time shift to generate the second internal control signal, wherein the third time shift is shorter than the second time shift.

11. The integrated semiconductor memory device as claimed in claim 1, wherein:

the latch circuit comprises a plurality of latches;

each of the latches includes an input terminal and an output terminal;

the input terminals are connected with each other for latching the first command signal in one of the latches depending on a state of the first control signal; and the output terminals are connected with each other for releasing the second command signal out of one of the latches depending on a state of the second control signal.

12. The integrated semiconductor memory device as claimed in claim 11, wherein each of the latches of the latch circuit includes a tri-state output.

13. The integrated semiconductor memory device as claimed in claim 7, wherein the clock generating circuit comprises a delay lock loop circuit for generating the second clock signal.

14. The integrated semiconductor memory device as claimed in claim 7, wherein the counter circuit of the first control circuit and the counter circuit of the second control circuit comprise ring counters.

15. Integrated semiconductor memory device as claimed in claim 7, wherein the counter circuit of the first control circuit and the counter circuit of the second control circuit perform a Gray-Code count.

16. The integrated semiconductor memory device as claimed in claim 7, wherein the counter circuit of the first control circuit and the counter circuit of the second control circuit perform a Binary-Code count.

17. The integrated semiconductor memory device as claimed in claim 7, wherein the shift register of the first control circuit and the shift register of the second control circuit are Barrel-shifters.

18. The integrated semiconductor memory as claimed in claim 8, wherein each of the latches of the first and second control circuits comprises flip-flops.

19. A method of synchronizing a signal with a clock signal in an integrated semiconductor memory device, comprising:

providing an integrated semiconductor memory device comprising at least a memory cell, a data terminal for supplying a data item as an output, a clock terminal for applying an external clock signal, a first control terminal for applying a configuration signal, a second control terminal for applying an external command signal synchronous with the external clock signal, a clock generating circuit for generating first and second clock signals, a first control circuit for generating a first control signal, a second control circuit for generating a second control signal, a latch circuit including a plurality of latches each for latching a first command signal and for releasing a second command signal;

applying the external clock signal to the clock terminal;

applying the configuration signal to the first control terminal;

applying the external command signal synchronous with the external clock signal at the second control terminal;

generating the first clock signal by the clock generating circuit derived from the external clock signal, the first clock signal being delayed with respect to the external clock signal;

generating an internal clock signal by the first control circuit derived from the first clock signal;

generating a first control signal by the first control circuit synchronous with the internal clock signal at a time which depends on the configuration signal;

generating the first command signal as a result of applying the external command signal at the second control terminal;

latching the first command signal in one of the latches of the latch circuit synchronous with the internal clock signal by actuating the one of the latches by a state of the first control signal;

generating the second clock signal by the clock generating circuit derived from the external clock signal, the second clock signal running time-shifted with respect to the first clock signal;

generating the second control signal by the second control circuit synchronous with the second clock signal at a time which depends on the configuration signal;

releasing the second command signal from the one of the latches of the latch circuit synchronous with the second clock signal by actuating the one of the latches by a state of the second control signal;

activating the memory cell for a read access as a result of applying the external command signal; and supplying a data item stored in the activated memory cell at the data terminal synchronous with the external clock signal, wherein the time between applying the external command signal and outputting the data item depends on the configuration signal.

20. The method as claimed in claim 19, further comprising:

providing the integrated semiconductor memory with an output circuit for providing a data item at a data terminal, wherein the data item is provided at the data terminal after a first delay time;

generating the first clock signal by the clock generating circuit, wherein the first clock signal is delayed in relation to the external clock signal by a second delay time;

generating the second clock signal by the clock generating circuit, wherein an edge of a first clock cycle of the second clock signal is generated by the clock generating circuit time shifted relative to an edge of a first clock cycle of the first clock signal by a first time shift having a time duration which is equal to a sum of the first and second delay time; and generating the internal clock signal by the first control circuit derived from the first clock signal, wherein an edge of a first clock cycle of the internal clock signal is generated by the first control circuit delayed relative to the edge of the first cycle of the first clock signal by a second time shift.

21. The method as claimed in claim 20, further comprising:

providing the integrated semiconductor memory device with a third control circuit for generating the first command signal synchronous with the first clock signal, wherein the third control circuit generates the first command signal delayed to the edge of the first clock cycle of the first clock signal by the second time shift.

22. The method as claimed in claim 21, further comprising:

generating the first control signal by the first control circuit at a second clock cycle of the internal clock signal, which is shifted by a number of clock cycles of the internal clock signal in relation to the first clock cycle of the internal clock signal, wherein the number of clock cycles is dependent on the configuration signal; and generating the second control signal from the second control circuit at the first clock cycle of the second clock signal.

* * * * *

UNITED STATES PATENT AND TRADEMARK OFFICE
CERTIFICATE OF CORRECTION

PATENT NO. : 7,170,819 B2 Page 1 of 1
APPLICATION NO. : 11/121171
DATED : January 30, 2007
INVENTOR(S) : Kazimierz Szczhpinski It is certified that error appears in the above-identified patent and that said Letters Patent is hereby corrected as shown below:

| Column | Line | Correction |
|---|---|---|
| 2 | 59 | Replace "ECO" with -- EC0 -- |
| 2 | 63 | Replace "ECO" with -- EC0 -- |
| 3 | 1 | Replace "ECO" with -- EC0 -- |
| 3 | 21 | Replace "ECO" with -- EC0 -- |
| 3 | 28 | Replace "ECO" with -- EC0 -- |
| 3 | 50 | Replace "ED1" with -- ED0 -- |
| 10 | 33 | Replace "10100" with -- IO100 -- |
| 12 | 65 | Replace "ECO" with -- EC0 -- |
| 14 | 63 | Replace "10" with -- I0 -- |
| 16 | 39 | Replace "10" with -- I0 -- |

Signed and Sealed this

Twenty Second Day of April, 2008

JON W. DUDAS
*Director of the United States Patent and Trademark Office*